US012439803B2

(12) United States Patent
Bae et al.

(10) Patent No.: US 12,439,803 B2
(45) Date of Patent: Oct. 7, 2025

(54) DISPLAY DEVICE AND METHOD OF MANUFACTURING THE SAME

(71) Applicant: Samsung Display Co., Ltd., Yongin-Si (KR)

(72) Inventors: Kwang Soo Bae, Yongin-si (KR); Gee Bum Kim, Seoul (KR); Bo Kwang Song, Hwaseong-si (KR); Dae Young Lee, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 545 days.

(21) Appl. No.: 17/877,137

(22) Filed: Jul. 29, 2022

(65) Prior Publication Data

US 2023/0109356 A1    Apr. 6, 2023

(30) Foreign Application Priority Data

Oct. 6, 2021    (KR) .................. 10-2021-0132209

(51) Int. Cl.
*H10K 59/12*    (2023.01)
*H10K 59/122*    (2023.01)
(Continued)

(52) U.S. Cl.
CPC ........... *H10K 59/65* (2023.02); *H10K 59/122* (2023.02); *H10K 59/124* (2023.02); *H10K 59/126* (2023.02); *H10K 71/00* (2023.02); *G06V 40/1318* (2022.01); *G09G 3/3233* (2013.01); *G09G 2300/0426* (2013.01); *G09G 2300/0819* (2013.01); *G09G 2300/0842* (2013.01); *G09G 2354/00* (2013.01); *H10K 59/1201* (2023.02)

(58) Field of Classification Search
CPC .... H10K 59/65; H10K 59/122; H10K 59/126; H10K 59/124; G09G 3/3233
USPC ......................................................... 257/40
See application file for complete search history.

(56) References Cited

U.S. PATENT DOCUMENTS

2010/0155578 A1* 6/2010 Matsumoto ............ H10K 59/65
250/216
2010/0320391 A1 12/2010 Antonuk
(Continued)

FOREIGN PATENT DOCUMENTS

CN    111312792 A    6/2020
CN    112436037 A    3/2021
(Continued)

OTHER PUBLICATIONS

Cite the machine translation . KR-20150043142-A.*
Cite the machine translation . Endo N (JP-2014072126-A).*

*Primary Examiner* — Phuc T Dang
(74) *Attorney, Agent, or Firm* — Innovation Counsel LLP

(57) ABSTRACT

A display device and a method of manufacturing the same are provided. A display device comprises a substrate, a first planarization layer disposed on the substrate, the first planarization layer including a recessed portion recessed from an upper surface of the first planarization layer, a first electrode disposed on an upper surface and side surfaces of the recessed portion formed in the first planarization layer, a pixel electrode disposed on the upper surface of the first planarization layer to be spaced apart from the first electrode, a photoelectric conversion layer disposed on the first electrode, and a light-emitting layer disposed on the pixel electrode.

18 Claims, 24 Drawing Sheets

180: 181, 182, 183
EL: 170, 175, 190
PD: 180, 185, 190

(51) Int. Cl.
  *H10K 59/124* (2023.01)
  *H10K 59/126* (2023.01)
  *H10K 59/65* (2023.01)
  *H10K 71/00* (2023.01)
  *G06V 40/13* (2022.01)
  *G09G 3/3233* (2016.01)

(56) References Cited

U.S. PATENT DOCUMENTS

2017/0012087 A1    1/2017   Seo et al.
2021/0397806 A1   12/2021   Lu et al.

FOREIGN PATENT DOCUMENTS

JP        2014072126 A   *   4/2014
KR     20150043142 A   *   4/2015

\* cited by examiner

180: 181, 182, 183
EL: 170, 175, 190
PD: 180, 185, 190

180: 181, 182, 183
EL: 170, 175, 190
PD: 180, 185, 190

DISPLAY DEVICE AND METHOD OF MANUFACTURING THE SAME

This application claims priority to Korean Patent Application No. 10-2021-0132209 filed on Oct. 6, 2021, in the Korean Intellectual Property Office, the disclosure of which is incorporated herein by reference in its entirety.

BACKGROUND

1. Field of the Disclosure

The present disclosure relates to a display device and a method of manufacturing the same.

2. Description of the Related Art

As the information society develops, the demand for display devices for displaying an image is increasing in various forms. For example, display devices are applied to various electronic devices such as a smart phone, a digital camera, a laptop computer, a navigation device, a smart watch, and a smart television. Display devices may be flat panel display such as a liquid crystal display device, a field emission display device, and an organic light emitting display device.

Research and development are currently under way on a technology for integrating sensors for touch recognition or fingerprint recognition in such a display device. To improve accuracy in fingerprint sensing, a region (or area) of light incident on each light sensor should be reduced. To reduce the region (or area) of light incident on a light sensor, various studies, such as reducing an opening of a light shielding layer or increasing the region of a light sensor, are under way.

SUMMARY

Aspects of the present disclosure provide a display device capable of improving accuracy in fingerprint sensing by increasing a distance between a light sensor and a light shielding layer.

Aspects of the present disclosure also provide a method of manufacturing a display device capable of improving accuracy in fingerprint sensing by increasing a distance between a light sensor and a light shielding layer.

It should be noted that objects of the present disclosure are not limited to the above-described objects, and other objects of the present disclosure will be apparent to those skilled in the art from the following descriptions.

According to the embodiments of the disclosure, a display device comprises a substrate, a first planarization layer disposed on the substrate, the first planarization layer including a recessed portion recessed from an upper surface of the first planarization layer, a first electrode disposed an upper surface and side surfaces of the recessed portion formed in the first planarization layer, a pixel electrode disposed on the upper surface of the first planarization layer to be spaced apart from the first electrode, a photoelectric conversion layer disposed on the first electrode, and a light-emitting layer disposed on the pixel electrode.

The first electrode may comprise a first portion disposed on the upper surface of the recessed portion, and a second portion disposed on the upper surface of the first planarization layer other than the recessed portion.

A first thickness of the first planarization layer overlapping the first portion may be different from a second thickness of the first planarization layer overlapping the pixel electrode.

The first thickness may be thinner than the second thickness.

The second portion may not be disposed in the recessed portion.

A third thickness of the first planarization layer overlapping the second portion may be thicker than the first thickness.

The display device may further include a second planarization layer disposed on the first planarization layer. The second planarization layer may include a first hole formed through the second planarization layer in an area corresponding the recessed portion and a contact hole formed in an area corresponding to the second portion of the first electrode.

The contact hole may expose a portion of a connection electrode disposed on the first planarization layer.

At least a portion of the photoelectric conversion layer is disposed on the recessed portion to be protruded toward the substrate.

A display device may further comprise a common electrode disposed on the photoelectric conversion layer and the light-emitting layer.

A first distance between the common electrode overlapping the photoelectric conversion layer and the first planarization layer may be smaller than a second distance between the common electrode overlapping the light-emitting layer and the first planarization layer.

According to another embodiment of the disclosure, a display device comprises a substrate, a first planarization layer disposed on the substrate, the first planarization layer including a recessed portion recessed from an upper surface of the first planarization layer, a first electrode disposed on the first planarization layer to overlap the recessed portion, a pixel electrode disposed on the first planarization layer, a photoelectric conversion layer disposed on the first electrode, a light-emitting layer disposed on the pixel electrode, and a common electrode disposed on the photoelectric conversion layer and the light-emitting layer, wherein a first distance between the common electrode overlapping the photoelectric conversion layer and the first planarization layer differs from a second distance between the common electrode overlapping the light-emitting layer and the first planarization layer.

The first distance may be smaller than the second distance.

A display device may further comprise a bank layer disposed on the first planarization layer to cover a portion of the first electrode and a portion of the pixel electrode, and a light shielding layer disposed on the bank layer.

A first distance between the photoelectric conversion layer and the light shielding layer may be different from a second distance between the light-emitting layer and the light shielding layer.

The first distance may be larger than the second distance.

The light shielding layer partially may overlap the photoelectric conversion layer.

The light shielding layer may not overlap the pixel electrode partitioned by the bank layer.

The first electrode may be disposed on an upper surface and side surfaces of the recessed portion.

According to the embodiments of the disclosure, a method of manufacturing a display device comprises forming a first planarization layer on a substrate, forming a recessed portion in the first planarization layer and the second planarization layer, forming a first electrode on an upper surface and side surfaces of the recessed portion, and a pixel electrode on the first planarization layer to be spaced apart from the recessed portion, forming a photoelectric conversion layer on the first electrode, forming a light-emitting layer on the pixel electrode, and forming a common electrode on the photoelectric conversion layer and the light-emitting layer.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present inventive concept. Similarly, the second element could also be termed the first element.

Hereinafter, specific embodiments will be described with reference to the accompanying drawings.

Figure 1:
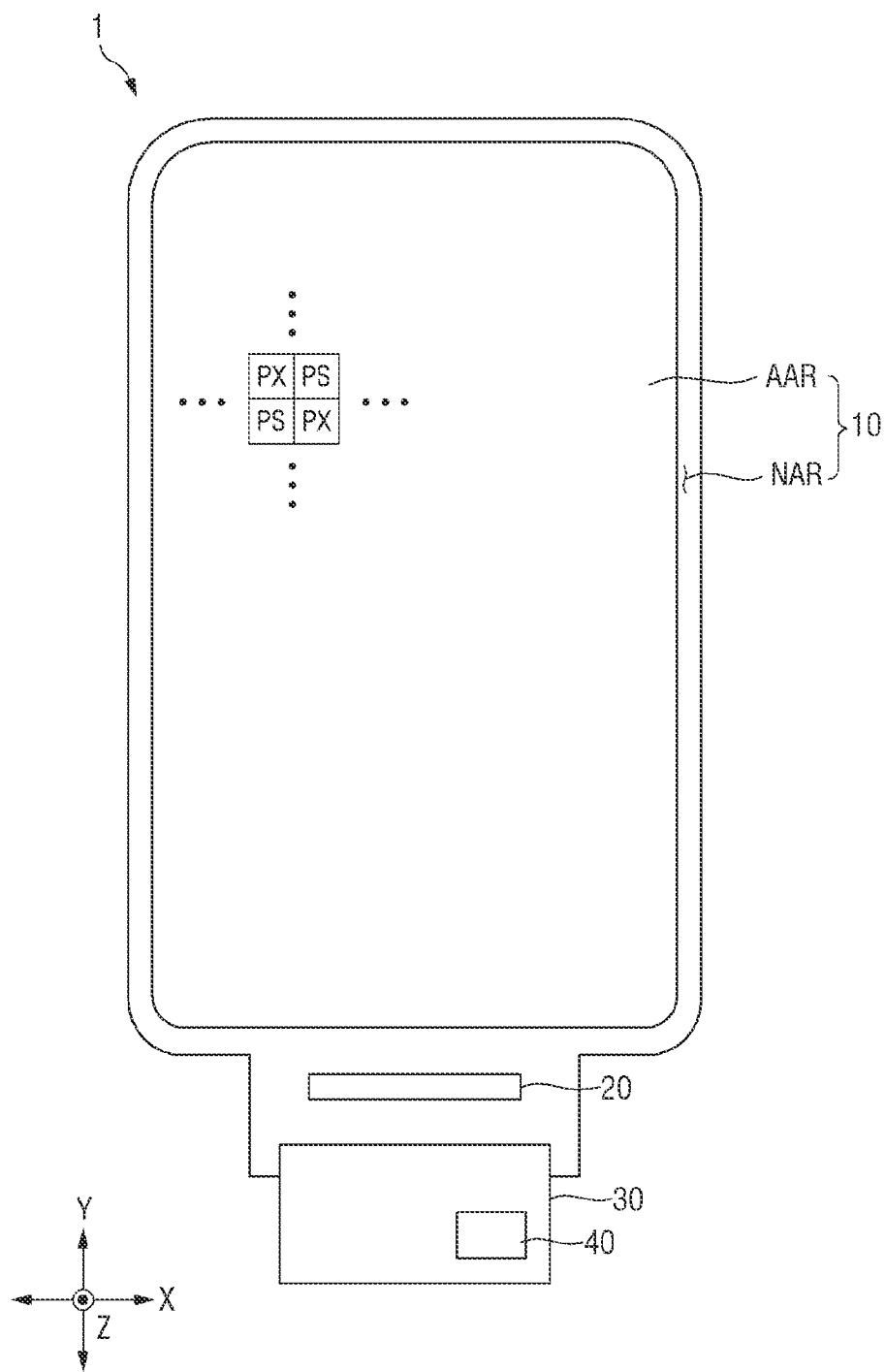
FIG. 1 is a plan view of a display device according to one embodiment.

FIG. 1 is a plan view of a display device according to one embodiment.

In FIG. 1, a first direction X, a second direction Y, and a third direction Z are shown. The first direction X is a direction parallel to one side of a display device 1 when viewed on a plane and may be, for example, a horizontal direction of the display device 1. The second direction Y is a direction parallel to another side in contact with one side of the display device 1 when viewed on the plane and may be, for example, a vertical direction of the display device 1. From now, for convenience of description, one side of the first direction X indicates a right direction in a plan view, the other side of the first direction X indicates a left direction in the plan view, one side of the second direction Y indicates an upward direction in the plan view, and the other side of the second direction Y indicates a downward direction in the plan view. The third direction Z may be a thickness direction of the display device 1. However, directions described in embodiments are understood as relative directions, and embodiments are not limited to the described directions.

Unless defined otherwise, an "upper portion" and "upper surface" described on the basis of the third direction Z mean a display surface side on the basis of a display panel, and a "lower portion," a "lower surface," and a "bottom surface" mean an opposite side to the display surface on the basis of the display panel.

Referring to FIG. 1, the display device 1 may include various electronic devices that provide a display screen. Examples of the display device 1 may include, but is not limited to, a mobile phone, a smart phone, a tablet personal computer (PC), a mobile communication terminal, an electronic organizer, an e-book, a personal digital assistant (PDA), a portable multimedia player (PMP), a navigation device, an ultra-mobile PC (UMPC), a television, a game machine, a wristband type electronic device, a head mount display, a monitor of a PC, a laptop computer, a vehicle dashboard, a digital camera, a camcorder, a billboard, an electronic board, various medical devices, various inspection devices, various home appliances including a display region, such as a refrigerator and a washing machine, an Internet of things (IoT) device, and the like. As a representative example, the display device 1 may be a smart phone, a tablet PC, or a laptop computer but is not limited thereto.

The display device 1 may include the display panel 10, a panel driver circuit 20, a circuit board 30, and a sensing driver circuit 40.

The display panel 10 may include an active region AAR and a non-active region NAR.

The active region AAR includes a display region in which an image is displayed. The active region AAR may completely overlap the display region. In the display region, a plurality of pixels PX for displaying an image may be disposed. Each of the pixels PX may include a light-emitting part EMA (see FIG. 7) that emits light.

The active region AAR may additionally include a light sensing region. The light sensing region is a region that reacts to light and configured to sense the amount, wavelength, etc. of incident light. The light sensing region may overlap the display region. According to one embodiment, the light sensing region may completely overlap the active region AAR in a plan view. In this case, the light sensing region may be identical to the display region. According to another embodiment, the light sensing region may be disposed only in a portion of the active region AAR. For example, the light sensing region may be disposed only in a restricted region required for fingerprint recognition. In this case, the light sensing region may overlap a portion of the display region but may not overlap another portion of the display region.

In the light sensing region, a plurality of photosensors PS that react to light may be disposed. Each of the photosensors PS may include a light sensing part RA (see FIG. 7) that senses incident light.

The non-active region NAR may be disposed around the active region AAR. In the non-active region NAR, the panel driver circuit 20 may be disposed. The panel driver circuit 20 may drive the plurality of pixels PX and/or the plurality of photosensors PS. The panel driver circuit 20 may output a signal and a voltage for driving the display panel 10. The panel driver circuit 20 may be formed as an integrated circuit (IC) and mounted on the display panel 10. In the non-active region NAR, signal lines for delivering a signal between the panel driver circuit 20 and the active region AAR may be additionally disposed. As another example, the panel driver circuit 20 may be mounted on the circuit board 30.

The circuit board 30 may be attached to one end of the display panel 10 using an anisotropic conductive film (ACF). Lead lines of the circuit board 30 may be electrically connected to a pad part of the display panel 10. The circuit board 30 may be a flexible printed circuit board or a flexible film such as a chip on film.

The sensing driver circuit 40 may be mounted on the circuit board 30. The sensing driver circuit 40 may be connected to the display panel 10. The sensing driver circuit 40 may sense a photo-current generated by the plurality of photosensors PS of the display panel 10. The sensing driver circuit 40 may recognize a user's touch or fingerprint on the basis of the photo-current.

Figure 2:
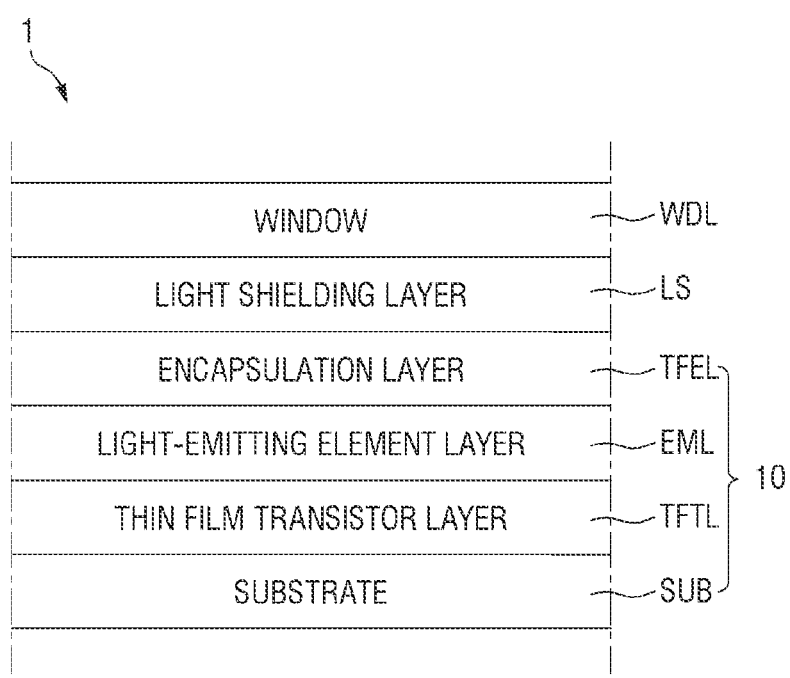
FIG. 2 is a schematic cross-sectional view of the display device according to one embodiment.

FIG. 2 is a schematic cross-sectional view of the display device according to one embodiment.

Referring to FIG. 2, the display device 1 may include the display panel 10, a light shielding layer LS, and a window WDL. The display panel 10 may include a substrate SUB, a thin film transistor layer TFTL, a light-sensitive element layer EML, and an encapsulation layer TFEL.

The substrate SUB may be a rigid substrate or a flexible substrate that is bendable, foldable, rollable, etc. The substrate SUB may be formed of an insulating material such as glass, quartz, and a polymer resin. Examples of the polymer resin may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), and combinations thereof.

The thin film transistor layer TFTL disposed on the substrate SUB may include a plurality of thin film transistors and a plurality of display signal lines. The plurality of display signal lines may include scan lines for transmitting a scan signal to each of the pixels and data lines for transmitting a data signal thereto.

Figure 8:
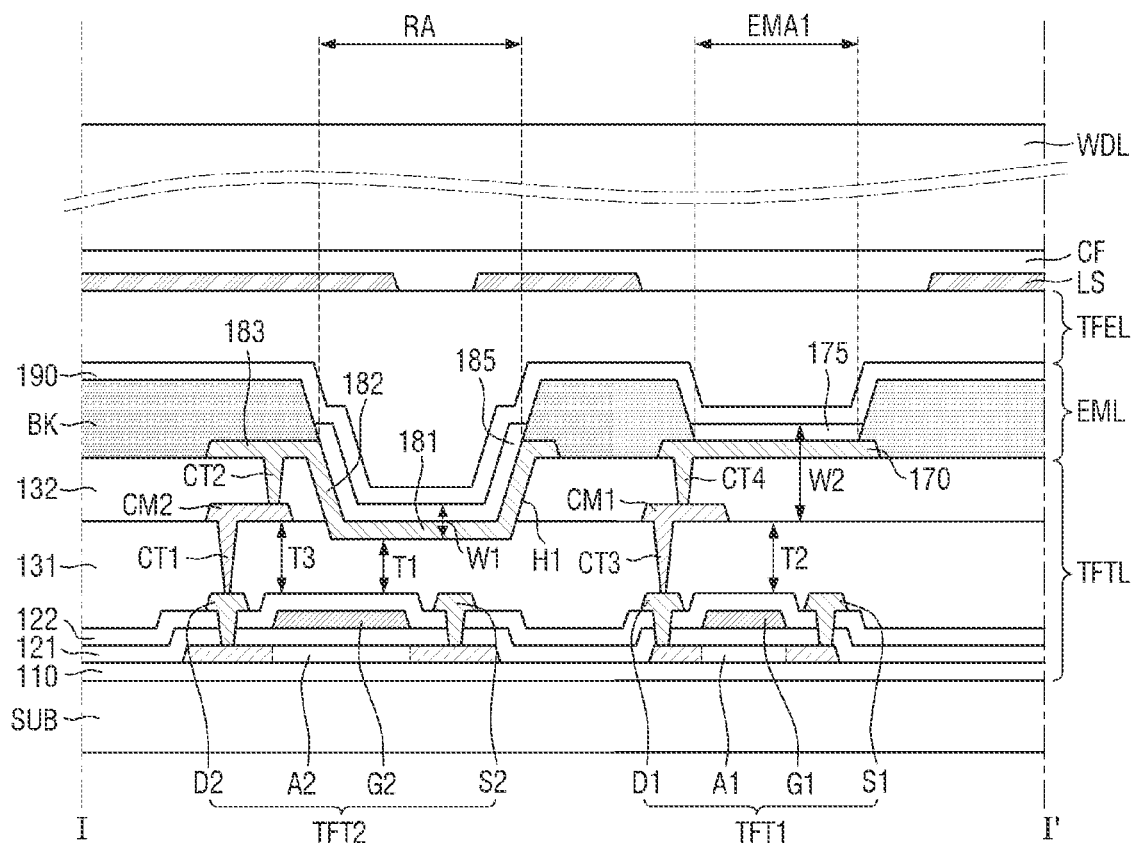
FIG. 8 is a cross-sectional view illustrating an example of the display device taken along line I-I' of FIG. 7.

The light-sensitive element layer EML disposed on one surface of the thin film transistor layer TFTL may include light-emitting elements EL (see FIG. 8) that emit light and photoelectric conversion elements PD (see FIG. 8).

An encapsulation layer TFEL may be disposed on the light-sensitive element layer EML. The encapsulation layer TFEL may include a stacked film of inorganic films or organic films to prevent moisture or oxygen from intruding into the light-emitting elements EL of the light-sensitive element layer EML.

The light shielding layer LS may be disposed on the encapsulation layer TFEL. The light shielding layer LS may include a material for shielding light emitted from the light-emitting elements EL or light incident onto the photoelectric conversion elements PD. The light shielding layer LS may be a black matrix formed of a metal material, a resin material including a pigment (carbon black or the like) or a dye, etc. Accordingly, the light shielding layer LS can prevent mixing of colors of pixels R, G, and B (see FIG. 7). The light shielding layer LS may be covered by a color filter CF (see FIG. 8).

Although not shown in the drawing, a touch sensing layer may be disposed on the encapsulation layer TFEL. The touch sensing layer may include a plurality of signal lines and a plurality of touch electrodes for sensing the user's touch. The touch sensing layer may be disposed on or under the light shielding layer LS.

The window WDL may be disposed on the light shielding layer LS. The window WDL may include a rigid material such as glass or quartz. The window WDL may be attached onto the display panel 10 by an optical transparent adhesive or the like.

Also, although not shown in the drawing, the display panel 10 and the window WDL may be coupled together by a transparent adhesive member interposed therebetween.

Figure 3:
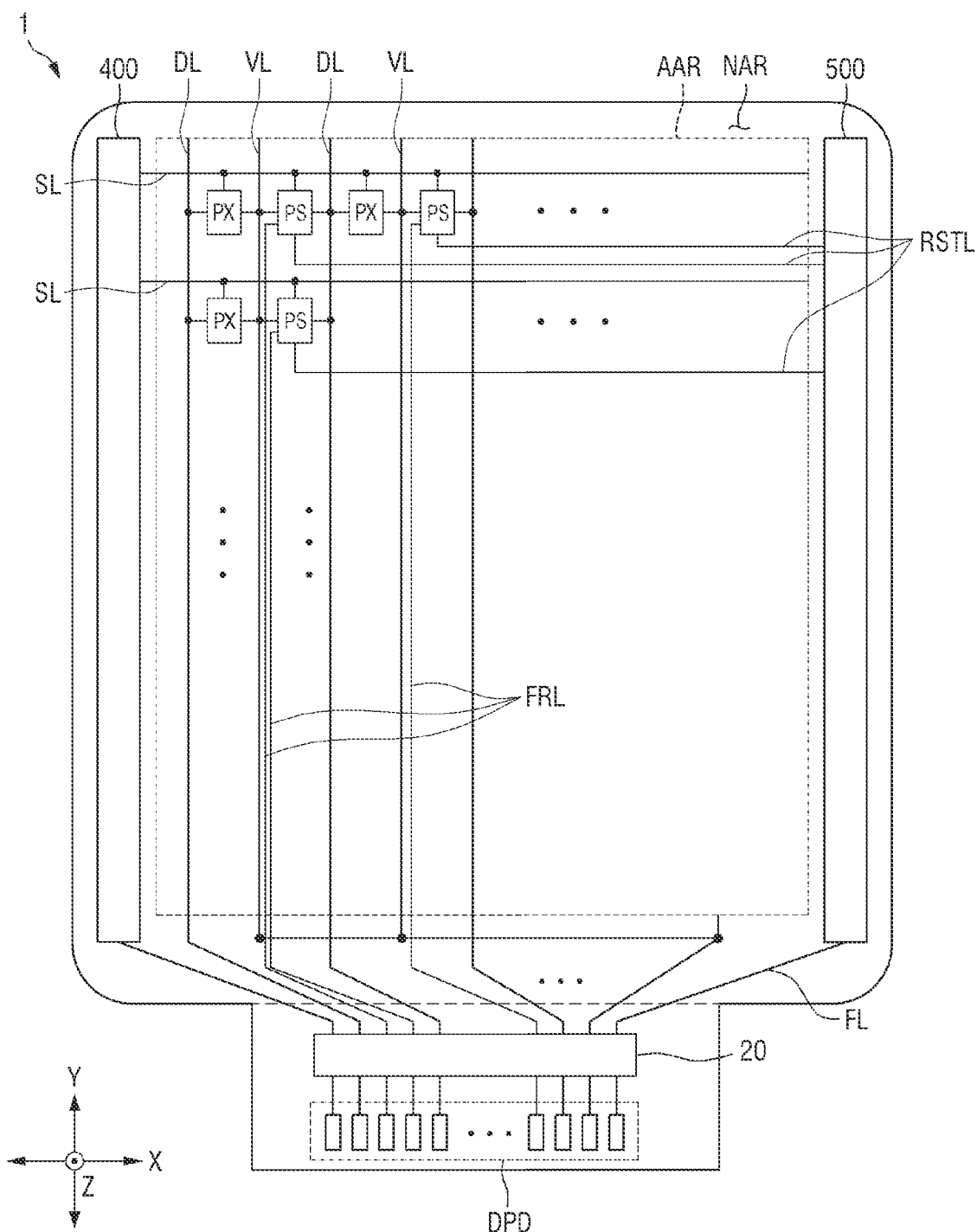
FIG. 3 is a schematic plan view of a display layer of the display device according to one embodiment.

FIG. 3 is a schematic plan view of a display layer of the display device according to one embodiment.

Referring to FIG. 3, in the active region AAR of the display panel 10, scan lines SL and power supply voltage lines VL connected to the plurality of pixels PX and the plurality of photosensors PS, data lines DL connected to the plurality of pixels PX, and reset signal lines RSTL and fingerprint sensing lines FRL connected to the plurality of photosensors PS may be disposed.

The scan lines SL may supply a scan signal received from a scan driver 400 to the plurality of pixels PX and the plurality of photosensors PS. The scan lines SL may extend in the first direction X and may be spaced apart from each other in the second direction Y.

The data lines DL may supply a data voltage received from the panel driver circuit 20 to the plurality of pixels PX. The data lines DL may extend in the second direction Y and may be spaced apart from each other in the first direction X.

The power supply voltage lines VL may supply a power supply voltage received from the panel driver circuit 20 to the plurality of pixels PX and the plurality of photosensors PS. The power supply voltage may be at least one of a first power supply voltage ELVDD, a second power supply voltage ELVSS, and an initialization voltage. The power supply voltage lines VL may extend in the second direction Y and may be spaced apart from each other in the first direction X in the active region AAR and may be connected to each other in the non-active region NAR.

The reset signal lines RSTL may supply a reset signal received from a reset signal generator 500 to the plurality of photosensors PS. The reset signal lines RSTL may extend in the first direction X and may be spaced apart from each other in the second direction Y.

The fingerprint sensing lines FRL may supply photocurrent generated by the photosensors PS to the sensing driver circuit 40. The fingerprint sensing lines FRL may extend in the second direction Y and may be spaced apart from each other in the first direction X.

The scan driver 400, fan-out lines FL, the reset signal generator 500, and the panel driver circuit 20 may be disposed on the non-active region NAR of the display panel 10. The sensing driver circuit 40 may be disposed on the non-active region NAR of the display panel 10 too.

The scan driver 400 may generate a plurality of scan signals in response to a scan control signal and sequentially supply the plurality of scan signals to the plurality of scan lines SL in a set order.

The fan-out lines FL may extend from the panel driver circuit 20 to the active region AAR. The fan-out lines FL may supply a data voltage received from the panel driver circuit 20 to the plurality of data lines DL. Also, the fan-out lines FL may transmit current received from the fingerprint sensing lines FRL to the panel driver circuit 20.

The reset signal generator 500 may generate a plurality of reset signals in response to a reset control signal and sequentially supply the reset signals to the plurality of reset signal lines RSTL. The photosensors PS connected to the reset signal lines RSTL may be supplied with the reset signals. The reset signal generator 500 may be omitted.

The panel driver circuit 20 may output signals and voltages for driving the display panel 10 to the fan-out lines FL. The panel driver circuit 20 may supply a data voltage to the data lines DL through the fan-out lines FL. The data voltage may be supplied to the plurality of pixels PX and may determine luminance of the plurality of pixels PX.

The sensing driver circuit 40 may measure the level of current of the photosensors PS through the fingerprint sensing lines FRL. The sensing driver circuit 40 may generate fingerprint sensing data according to the level of current sensed by the photosensors PS and transmit the fingerprint sensing data to a main processor. The main processor may analyze the fingerprint sensing data and determine whether the fingerprint sensing data corresponds to a user's fingerprint by comparing the fingerprint sensing data with a preset fingerprint. As another example, the sensing driver circuit 40 may be embedded in the panel driver circuit 20.

Also, the panel driver circuit 20 may supply a scan control signal to the scan driver 400 through a scan control line.

The non-active region NAR of the display panel 10 may include a display pad part DPD. The display pad part DPD may be electrically connected to the circuit board 30 using a low-resistance and highly-reliable material such as ACF or Sn—Ag—Pb (SAP). The display pad part DPD may include a plurality of display pads.

According to this embodiment, when each scan line SL is simultaneously connected to the plurality of pixels PX and the plurality of photosensors PS disposed in the same row, the plurality of pixels PX and the plurality of photosensors PS may be turned on or off in response to the same scan signal. Accordingly, during a period of displaying a screen, it is possible to sense the shape of a fingerprint in an optical manner. However, embodiments are not limited thereto, and the type and arrangement of signal lines may be modified.

Figure 4:
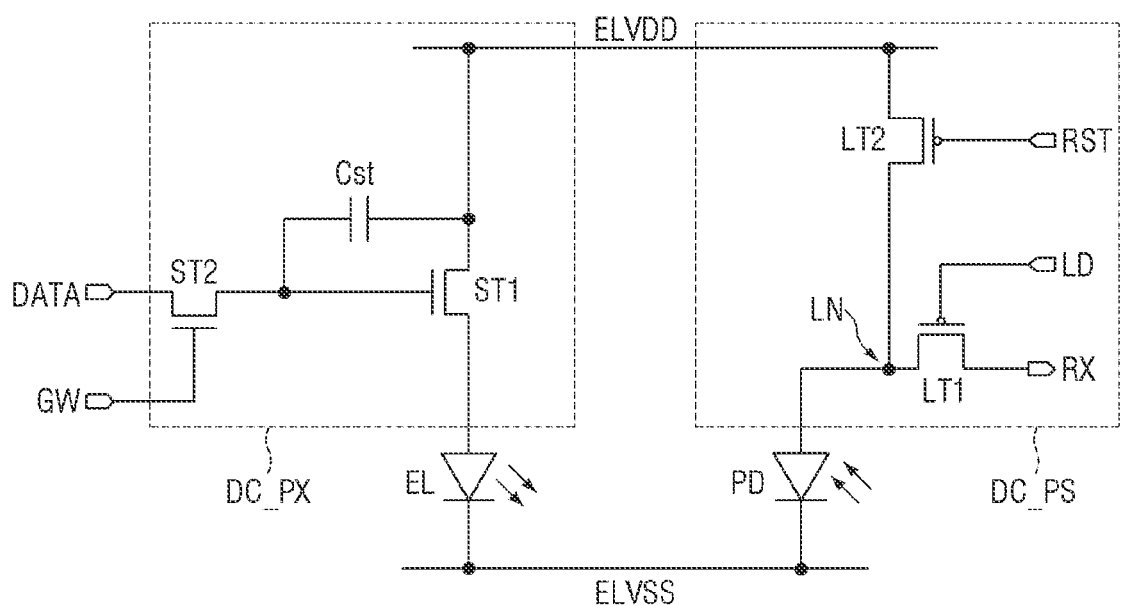
FIG. 4 is a circuit diagram of a pixel and a light sensor according to one embodiment.

FIG. 4 is a circuit diagram of a pixel and a light sensor according to one embodiment.

Referring to FIG. 4, the display panel 10 may include a display driver circuit DC_PX for controlling the amount of light emitted from the plurality of pixels PX and a sensing driver circuit DC_PS for sensing the amount of light received by the plurality of photosensors PS. The display panel 10 may apply a driving signal or a driving voltage to one or more transistors and various signal lines included in the display driver circuit DC_PX and the sensing driver circuit DC_PS.

The display driver circuit DC_PX and the sensing driver circuit DC_PS may be formed as separate integrated circuits or may be integrated into one integrated circuit as shown in the drawing.

The display driver circuit DC_PX may include a light-emitting element EL, a capacitor Cst, a first transistor ST1, and a second transistor ST2. The display driver circuit DC_PX may receive a data signal DATA, a first scan signal GW, the first power supply voltage ELVDD, and the second power supply voltage ELVSS. The data signal DATA may be provided through the panel driver circuit 20 connected to the data lines DL. The first scan signal GW may be provided through the scan driver 400 connected to the scan lines SL.

Each of the light-emitting elements EL may be an organic light-emitting diode that includes an anode, a cathode, and a light-emitting layer 175 (see FIG. 8) disposed between the anode and the cathode. Otherwise, each of the light-emitting elements EL may be an inorganic light-emitting element including an anode, a cathode, and an inorganic semiconductor disposed between the anode and the cathode. Otherwise, each of the light-emitting elements EL may be a quantum dot light-emitting element including an anode, a cathode, and a quantum dot light-emitting layer disposed between the anode and the cathode. Otherwise, each of the light-emitting elements EL may be a micro-light emitting diode (micro-LED).

The light-emitting element EL may emit light with certain luminance according to a driving current supplied from the second transistor ST2. The anode of the light-emitting element EL is connected to the first transistor ST1. The cathode of the light-emitting element EL is connected to a terminal of the second power supply voltage ELVSS to receive the second power supply voltage ELVSS. The anode of the light-emitting element EL may correspond to a pixel electrode 170 of FIG. 8, and the cathode may correspond to a common electrode 190 of FIG. 8.

The capacitor Cst may be connected between a gate electrode of the first transistor ST1 and a terminal of the first power supply voltage ELVDD. The capacitor Cst includes a first capacitor electrode connected to the gate electrode of the first transistor ST1 and a second capacitor electrode connected to the terminal of the first power supply voltage ELVDD.

The first transistor ST1 may be a driving transistor, and the second transistor ST2 may be a switching transistor. Each transistor may include a gate electrode, a source electrode, and a drain electrode. Any one of the source electrode and the drain electrode may be one electrode, and the other may be the other electrode. For convenience of description, an example in which the drain electrode is one electrode and the source electrode is the other electrode will be described below.

The first transistor ST1, the driving transistor, may generate a driving current. The gate electrode is connected to the first capacitor electrode, the one electrode is connected to the terminal of the first power supply voltage ELVDD, and the other electrode is connected to the anode of the light-emitting element EL. The second capacitor electrode is connected to the one electrode of the first transistor ST1. In a cross-sectional view, the first transistor ST1 may be a first thin film transistor TFT1 (see FIG. 8) that is disposed in the thin film transistor layer TFTL and connected to the pixel electrode 170.

The second transistor ST2 is a switching transistor. The gate electrode of the second transistor ST2 is connected to a terminal of the first scan signal GW, the one electrode is connected to a terminal of the data signal DATA, and the other electrode is connected to the gate electrode of the first transistor ST1. The second transistor ST2 may be turned on according to the first scan signal GW to perform a switching operation of transmitting the data signal DATA to the gate electrode of the first transistor ST1.

The capacitor may be charged with a voltage corresponding to the data signal DATA received from the second transistor ST2. The first transistor ST1 may control the driving current flowing to the light-emitting element EL according to the amount of charge stored in the capacitor Cst.

However, this is only an example, and the display driver circuit DC_PX may have a three-transistor one-capacitor (3T1C) or seven-transistor one-capacitor (7T1C) structure that additionally includes a compensation circuit for compensating for a threshold voltage deviation ΔVth of the first transistor ST1, and the like.

The sensing driver circuit DC_PS may include a sensing transistor LT1, a reset transistor LT2, and the photoelectric conversion element PD. Also, the sensing driver circuit DC_PS may additionally include a sensing node LN to which the sensing transistor LT1, the reset transistor LT2, and the photoelectric conversion element PD are commonly connected. A fingerprint scan signal LD, a fingerprint sensing signal RX, and a reset signal RST may be applied to the sensing driver circuit DC_PS. The fingerprint scan signal LD may be provided through the scan driver 400 connected to the scan lines SL, but a provider of the fingerprint scan signal LD is not limited thereto. The fingerprint sensing signal RX may be provided through the sensing driver circuit 40 connected to the fingerprint sensing lines FRL. The reset signal RST may be provided through the reset signal generator 500 connected to the reset signal lines RSTL.

Each of the photoelectric conversion elements PD may include an anode, a cathode, and a photoelectric conversion layer 185 (see FIG. 8) disposed between the anode and the cathode. Each of the photoelectric conversion elements PD may convert externally incident light into an electrical signal. The photoelectric conversion elements PD may be light-receiving diodes or phototransistors formed of a p-n or p-i-n inorganic material. Alternatively, the photoelectric conversion elements PD may be organic light-receiving diodes employing an organic material.

The anode of the photoelectric conversion element PD may be connected to the sensing node LN. The cathode of the photoelectric conversion element PD may be connected to the terminal of the second power supply voltage ELVSS to receive the second power supply voltage ELVSS. The anode of the photoelectric conversion element PD may correspond to a first electrode 180 of FIG. 8, and the cathode may correspond to the common electrode 190 of FIG. 8.

The photoelectric conversion element PD may generate photo-charge in proportion to intensity of incident light. Accumulated photo-charge may be converted into an electrical signal required for sensing according to an anode voltage and a cathode voltage applied from the thin film transistor layer TFTL.

When exposed to external light, the photoelectric conversion element PD may generate photo-charge which may be accumulated in the anode of the photoelectric conversion element PD. In this case, a voltage at the sensing node LN electrically connected to the anode may increase. When a terminal of the fingerprint sensing signal RX is connected to the photoelectric conversion element PD, a current may flow due to a voltage difference between the sensing node LN in which charge is accumulated and the terminal of the fingerprint sensing signal RX.

A gate electrode of the sensing transistor LT1 may be connected to a terminal of the fingerprint scan signal LD, one electrode thereof may be connected to the sensing node LN, and the other electrode thereof may be connected to the terminal of the fingerprint sensing signal RX. The sensing transistor LT1 may be turned in response to the fingerprint scan signal LD and transmit the accumulated photo-charge generated by the photoelectric conversion element PD to the terminal of the fingerprint sensing signal RX. As shown in FIG. 8, the sensing transistor LT1 may be a second thin film transistor TFT2 of the thin film transistor layer TFTL.

A gate electrode of the reset transistor LT2 may be connected to the terminal of the reset signal RST, one electrode thereof may be connected to the terminal of the first power supply voltage ELVDD, and the other electrode thereof may be connected to the sensing node LN. In this case, the sensing node LN and the anode of the photoelectric conversion element PD may be reset to the first power supply voltage ELVDD.

Although a case in which each transistor is a n-type metal oxide semiconductor (NMOS) transistor is illustrated in the drawing, some or all of the transistors may be p-type metal oxide semiconductor (PMOS) transistors.

A factor that determines a region (or area) LR of light incident on a photosensor PS of a display device according to one embodiment will be described below. In this specification, the region (or area) LR of light incident on the photosensor PS is referred to as a fingerprint sensing region LR for convenience of description.

Figure 5:
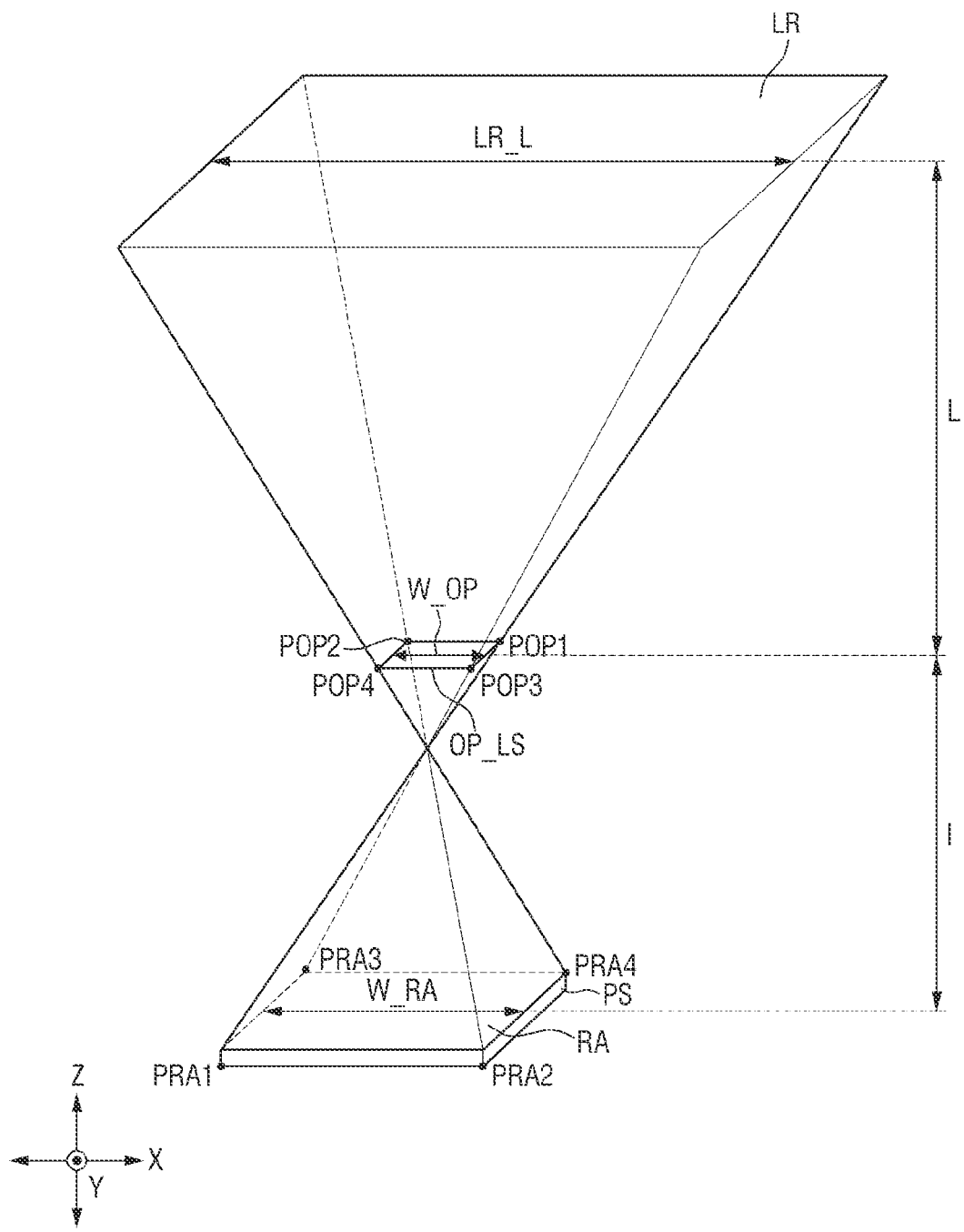
FIG. 5 illustrates an example of a fingerprint sensing region of the display device according to one embodiment.
Figure 6:
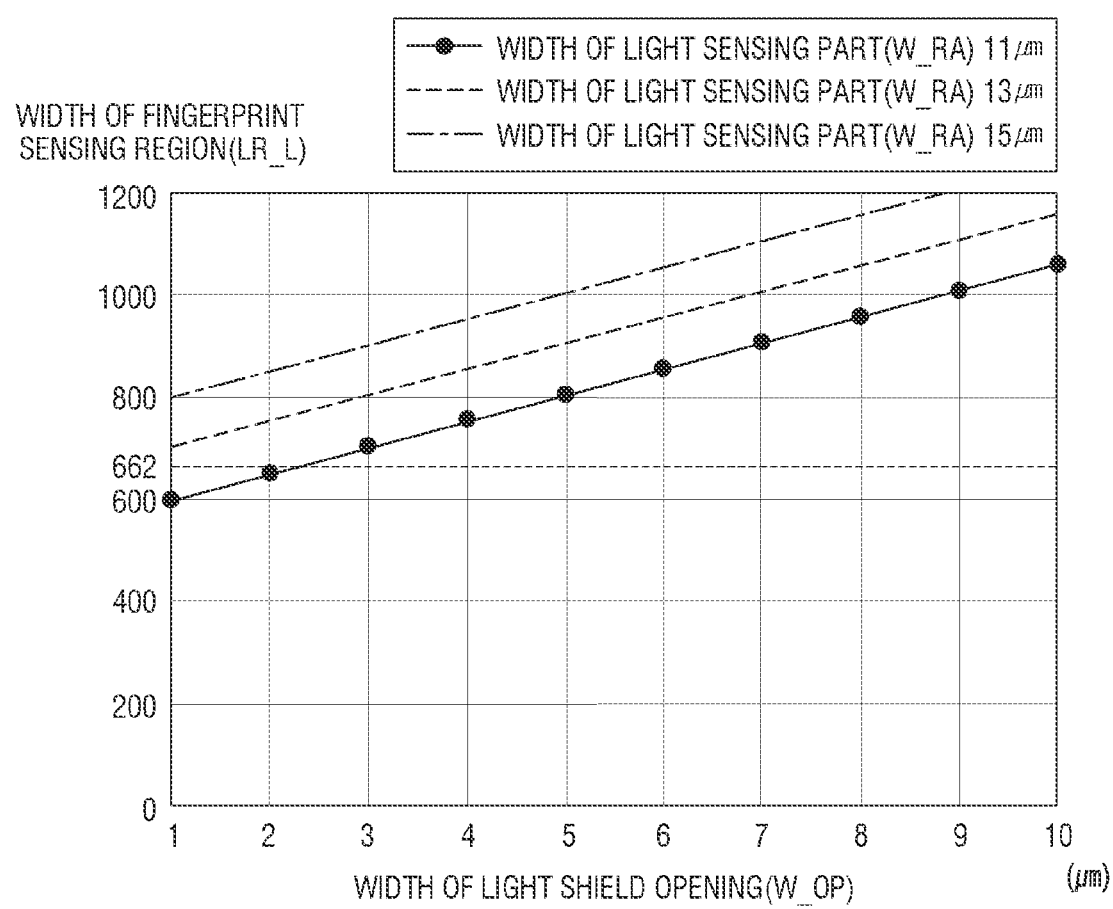
FIG. 6 is a graph illustrating a change in width of the fingerprint sensing region of the display device according to one embodiment.

FIG. 5 is an example illustrating a region of light incident on a photosensor of the display device according to one embodiment, and FIG. 6 is a graph illustrating a width of a fingerprint sensing region of the display device according to one embodiment.

Referring to FIGS. 5 and 6, with a reduction in the fingerprint sensing region LR, a region from which a fingerprint F (see FIG. 12) is acquired may be smaller. When the region from which the fingerprint F is acquired is reduced, it is possible to accurately sense a ridge R (see FIG. 12) or a valley V (see FIG. 12) of the fingerprint, and thus accuracy in fingerprint sensing can be improved. For example, the region from which the fingerprint F is acquired can sense an accurate fingerprint when a one-direction width LR_L is 662 μm or less.

The fingerprint sensing region LR may be set by points at which an upper surface of the window WDL meets a line connecting a first vertex PRA1 of an upper surface of the light sensing part RA and a first vertex POP1 of a light shield opening OP_LS, a line connecting a second vertex PRA2 of the upper surface of the light sensing part RA and a second vertex POP2 of the light shield opening OP_LS, a line connecting a third vertex PRA3 of the upper surface of the light sensing part RA and a third vertex POP3 of the light shield opening OP_LS, and a line connecting a fourth vertex PRA4 of the upper surface of the light sensing part RA and a fourth vertex POP4 of the light shield opening OP_LS.

Therefore, the fingerprint sensing region LR may vary according to a width W_RA of the light sensing part RA, a width W_OP of the light shield opening OP_LS of the light shielding layer LS, a distance L between the light shielding layer LS and the window WDL, and a distance l between the light shielding layer LS and the photosensor PS.

As an example, with a decrease in the width W_RA of the light sensing part RA, the fingerprint sensing region LR may be reduced. As another example, with a decrease in the width W_OP of the light shield opening OP_LS, the fingerprint sensing region LR may become smaller. Also, the fingerprint sensing region LR may become smaller with a decrease in the distance L between the light shielding layer LS and the window WDL and may become smaller with an increase in the distance l between the light shielding layer LS and the photosensor PS.

Referring to the graph of FIG. 6, for example, the fingerprint sensing region LR (or the width LR_L thereof) may become smaller when the width W_RA of the light sensing part RA is 13 μm or 11 μm than when the width W_RA is 15 μm. Also, the fingerprint sensing region LR (or the width LR_L thereof) may become smaller when the width W_OP of the light shield opening OP_LS is 2 μm than when the width W_OP is 6 μm.

In the display device 1 according to this embodiment, the fingerprint sensing region LR may be reduced by increasing the distance 1 between the light shielding layer LS and the photosensor PS. Accordingly, it is possible to implement the display device 1 that can ensure accuracy in fingerprint sensing while minimizing a reduction in the amount of light received by the photosensor PS.

Figure 7:
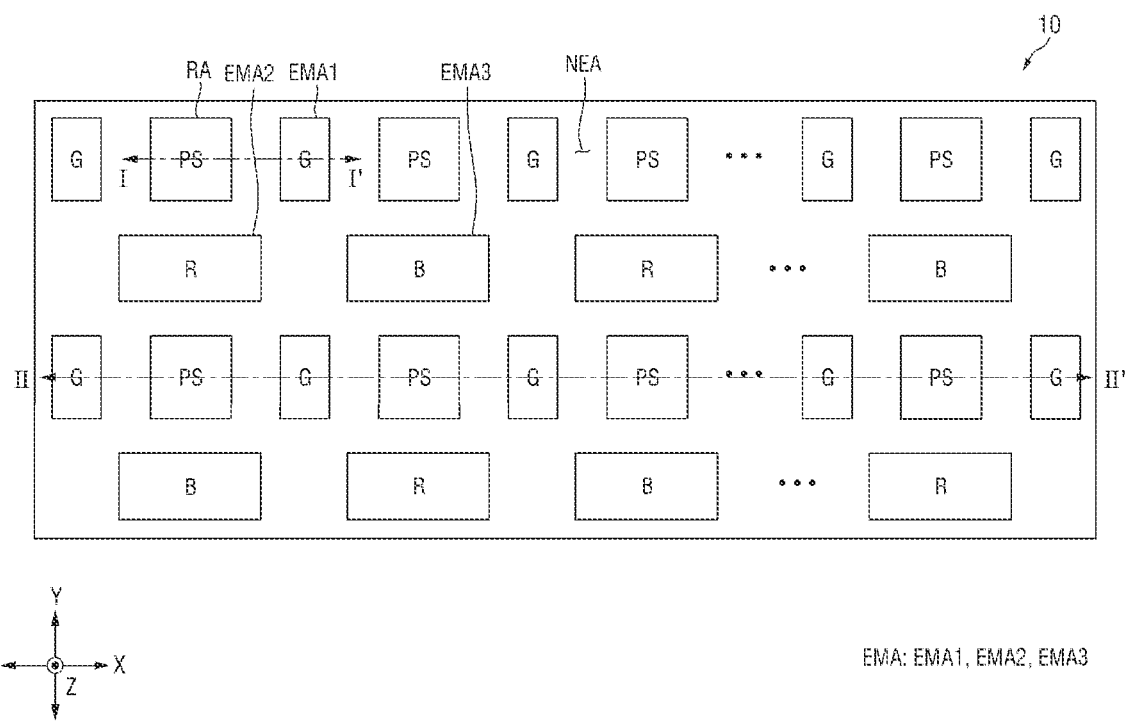
FIG. 7 is a diagram showing a planar arrangement of pixels and light sensors in a display panel according to one embodiment.

FIG. 7 is a diagram showing a planar arrangement of pixels and light sensors in a display panel according to one embodiment.

The plurality of pixels PX (R, G, and B) included in the display panel 10 may include a plurality of light-emitting parts EMA (EMA1, EMA2, and EMA3) that emit light in the active region AAR (or the display region). In a cross-sectional view, the plurality of light-emitting parts EMA may be defined as regions in which pixel electrodes 170 exposed through openings of a bank layer BK and regions in which the exposed pixel electrodes 170 overlap the light-emitting layer 175.

The plurality of photosensors PS included in the display panel 10 may include a plurality of light sensing parts RA that sense incident light in the active region AAR (or the light sensing region). The light sensing parts RA may be defined as regions in which first electrodes 180 are exposed through openings of the bank layer BK and regions in which the exposed first electrodes 180 overlap the photoelectric conversion layer 185 in a cross-sectional view.

A non-light-emitting region is disposed between the light-emitting parts EMA of each pixel PX. Also, a non-sensing region is disposed between the light sensing parts RA of the photosensors PS. According to this embodiment, a region in which the non-light-emitting region overlaps the non-sensing region will be referred to as a nearby portion NEA.

Each of the plurality of pixels PX may include a green pixel G, a red pixel R, and a blue pixel B. The green pixel G emits light of a green wavelength, the red pixel R emits light of a red wavelength, and the blue pixel B emits light of a blue wavelength. The photosensors PS may absorb light of a green wavelength emitted from adjacent green pixels G and convert the absorbed light into electrical signals but is not limited thereto. On the other hand, the photosensors PS may recognize light of a red or blue wavelength as noise.

The color pixels and the photosensors PS may be alternately arranged. For example, the green pixel G and the photosensor PS may be alternately arranged in the first direction X to form a first row, and the red pixel R and the blue pixel B may be alternately arranged in the first direction X to form a second row adjacent to the first row. Color pixels in the first row may be alternately arranged in the first direction X with respect to color pixels in the second row. The number of green pixels G in the first row may be double the number of red pixels R or blue pixels B in the second row. Also, the number of photosensors PS in the first row may be double the number of red pixels R or blue pixels B in the second row. The arrangement of the first row and the second row may be repeated up to an $n^{th}$ row.

The light-emitting parts EMA of the color pixels may vary in size. When a light-emitting region of the green pixel G is referred to as a first light-emitting part EMA1, a light-emitting region of the red pixel R is referred to as a second light-emitting part EMA2, and a light-emitting region of the blue pixel B is referred to as a third light-emitting part EMA3, the first light-emitting part EMA1 may be smaller than the second light-emitting part EMA2 and/or the third light-emitting part EMA3. The third light-emitting part EMA3 may be larger than the second light-emitting part EMA2 or may be substantially the same as the second light-emitting part EMA2.

Although the light-emitting parts EMA of the color pixels are shown in rectangular shapes, the shapes are not limited thereto, and each of the light-emitting parts EMA may have an octagonal shape, a circular shape, a rhombus shape, or another polygonal shape. Although the light sensing parts RA are shown in a square shape, the shape is not limited thereto, and each of the light sensing parts RA may have an octagonal shape, a circular shape, a rhombus shape, or another polygonal shape.

FIG. 8 is a cross-sectional view illustrating an example of the display device taken along line I-I' of FIG. 7.

Referring to FIG. 8, a buffer layer 110 is disposed on the substrate SUB. The buffer layer 110 may include silicon nitride, silicon oxide, silicon oxynitride, etc.

On the buffer layer 110, the first thin film transistor TFT1 and the second thin film transistor TFT2 may be disposed.

The plurality of thin film transistors TFT1 and TFT2 may respectively include semiconductor layers A1 and A2, a gate insulating layer 121 disposed on a portion of each of the semiconductor layers A1 and A2, gate electrodes G1 and G2 disposed on the gate insulating layer 121, an interlayer insulating film 122 covering the semiconductor layers A1 and A2 and the gate electrodes G1 and G2, and source electrodes S1 and S2 and drain electrodes D1 and D2 disposed on the interlayer insulating film 122.

The semiconductor layers A1 and A2 may form channels of the first thin film transistor TFT1 and the second thin film transistor TFT2, respectively. The semiconductor layers A1 and A2 may include polycrystalline silicon. According to another embodiment, the semiconductor layers A1 and A2 may include monocrystalline silicon, low-temperature polycrystalline silicon, amorphous silicon, or an oxide semiconductor. The oxide semiconductor may include a binary compound (ABx), a ternary compound (ABxCy), or a quaternary compound (ABxCyDz) containing, for example, indium, zinc, gallium, tin, titanium, aluminum, hafnium (Hf), zirconium (Zr), magnesium (Mg), etc. Each of the semiconductor layers A1 and A2 may include a channel region, and a source region and a drain region doped with impurities.

On the semiconductor layers A1 and A2, the gate insulating layer 121 may be disposed. The gate insulating layer 121 electrically insulates the first gate electrode G1 from the first semiconductor layer A1 and electrically insulates the second gate electrode G2 from the second semiconductor layer A2. The gate insulating layer 121 may be formed of an insulating material, for example, silicon oxide (SiOx), silicon nitride (SiNx), metal oxide, or the like.

On the gate insulating layer 121, the first gate electrode G1 of the first thin film transistor TFT1 and the second gate electrode G2 of the second thin film transistor TFT2 are disposed. The gate electrodes G1 and G2 may be formed on the channel region of the semiconductor layers A1 and A2, respectively, that is, at a portion of the gate insulating layer 121 overlapping the channel region.

The interlayer insulating film 122 may be disposed on the gate electrodes G1 and G2. The interlayer insulating film 122 may include an inorganic insulating material such as silicon oxide (SiOx), silicon nitride (SiNx), silicon oxynitride, hafnium oxide, and aluminum oxide. Also, although not shown in the drawing, the interlayer insulating film 122 may be formed of a plurality of insulating films, and a conductive layer for forming a second capacitor electrode may be further included between the insulating films.

The source electrodes S1 and S2 and the drain electrodes D1 and D2 are disposed on the interlayer insulating film 122. The first source electrode S1 of the first thin film transistor TFT1 may be electrically connected to the source region of the first semiconductor layer A1 through a contact hole passing through the interlayer insulating film 122 and the gate insulating layer 121. The second source electrode S2 of the second thin film transistor TFT2 may be electrically connected to the source region of the second semiconductor layer A2 through a contact hole passing through the interlayer insulating film 122 and the gate insulating layer 121. Each of the source electrodes S1 and S2 and the drain electrodes D1 and D2 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A first planarization layer 131 may be formed on the interlayer insulating film 122 to cover each of the source electrodes S1 and S2 and the drain electrodes D1 and D2. The first planarization layer 131 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, or benzocyclobutene (BCB). The first planarization layer 131 may have a flat surface.

The first planarization layer 131 may include a third contact hole CT3 that exposes the first drain electrode D1. Also, the first planarization layer 131 may include a first contact hole CT1 that exposes any the second drain electrode D2.

A first connection electrode CM1 and a second connection electrode CM2 may be disposed on the first planarization layer 131. The first connection electrode CM1 may be electrically connected to the first drain electrode D1 through the third contact hole CT3 passing through the first planarization layer 131. The second connection electrode CM2 may be electrically connected to an the second drain electrode D2 through the first contact hole CT1 passing through the first planarization layer 131. The connection electrodes CM1 and CM2 may include the same material as the source electrodes S1 and S2 or the drain electrodes D1 and D2 described above.

A second planarization layer 132 may be formed on the first planarization layer 131 to cover the connection electrodes CM1 and CM2. The second planarization layer 132 may include the same material as the above-described first planarization layer 131. The second planarization layer 132 may have a flat surface. The second planarization layer 132 may include a second contact hole CT2 exposing the second connection electrode CM2 and a fourth contact hole CT4 exposing the first connection electrode CM1.

The first planarization layer 131 and the second planarization layer 132 may include a first hole H1 that is formed through the second planarization layer 132 and forms a recess portion recessed from a top surface of the first planarization layer 131. For example, the first hole H1 may completely pass through the second planarization layer 132 and partially pass through the first planarization layer 131 to form a recess portion recessed from a top surface of the first planarization layer 131. Accordingly, side surfaces and an upper surface of the recessed portion of the first planarization layer 131 and side surfaces of the second planarization layer 132 may be exposed through the first hole H1. The first hole H1 may provide a space in which the first electrode 180, the photoelectric conversion layer 185, and the common electrode 190 of the photoelectric conversion element PD to be described below are formed, and a region in which the first electrode 180 and the photoelectric conversion layer 185 overlap in the first hole H1 may be defined as the light sensing part RA.

A thickness of the first planarization layer 131 may vary depending on whether the first hole H1 is formed. For example, a first thickness T1 of the first planarization layer 131 disposed in a region exposed through the first hole H1 may be smaller than a second thickness T2 or a third thickness T3 of the first planarization layer 131 not exposed through the first hole H1.

The light-sensitive element layer EML may be disposed on the second planarization layer 132. The light-sensitive element layer EML may include the light-emitting element EL and the photoelectric conversion element PD. Specifically, the light-sensitive element layer EML may include the pixel electrode 170, the first electrode 180, the bank layer BK, the light-emitting layer 175, the photoelectric conversion layer 185, and the common electrode 190.

The pixel electrode 170 may be disposed on the second planarization layer 132 and provided for each pixel PX. The pixel electrode 170 may be connected to the first connection electrode CM1 through the fourth contact hole CT4. The pixel electrode 170 may be spaced apart from the first hole H1 and the first electrode 180. In other words, the pixel electrode 170 may be disposed on the second planarization layer 132 not exposed through the first hole H1. The pixel electrode 170 may have, but is not limited to, a stacked film structure in which a high work function material, for example, indium-tin-oxide (ITO), indium-zinc-oxide (IZO), zinc oxide (ZnO), or indium oxide (In2O3), and a reflective material, for example, silver (Ag), magnesium (Mg), aluminum (Al), platinum (Pt), lead (Pb), gold (Au), nickel (Ni), or a compound thereof are stacked. The high work function material may be disposed in an upper portion than the reflective material to face the common electrode 190. The pixel electrode 170 may have, but is not limited to, a multilayered structure of ITO/Mg, ITO/MgF, ITO/Ag, or ITO/Ag/ITO.

The first electrode 180 may be disposed on the first planarization layer 131 and the second planarization layer 132 and provided for each photosensor PS. At least one portion of the first electrode 180 is disposed on the first planarization layer 131 and the second planarization layer 132 exposed through the first hole H1, and the other portion is disposed on the second planarization layer 132 not exposed through the first hole H1. The first electrode 180 may have a shape protruding toward the substrate SUB and include a first portion 181, first side surface portions 182, and second portions 183.

The first portion 181 of the first electrode 180 may be disposed on the upper surface of the first planarization layer 131 exposed through the first hole H1. The first portion 181 may be formed at a closer position to the substrate SUB than the pixel electrode 170. Also, the first thickness T1 of the first planarization layer 131 overlapping the first portion 181 may differ from the second thickness T2 of the first planarization layer 131 overlapping the pixel electrode 170.

The first side surface portions 182 of the first electrode 180 may be disposed on side surfaces of the first planarization layer 131 and side surfaces of the second planarization layer 132 exposed through the first hole H1.

The second portions 183 of the first electrode 180 may be disposed on upper surfaces of the second planarization layer 132 not exposed through the first hole H1. The second portions 183 may be connected to the second connection electrode CM2 through the second contact hole CT2 passing through the second planarization layer 132. Heights of upper surfaces of the second portions 183 may be substantially the same as heights of an upper surface of the pixel electrode 170. Also, the third thickness T3 of the first planarization layer 131 overlapping the second portions 183 may be substantially the same as the second thickness T2 of the first planarization layer 131. The third thickness T3 of the first planarization layer 131 may be larger than the first thickness T1 of the first planarization layer 131.

The first electrode 180 may include, but is not limited to, substantially the same material as the above-described pixel electrode 170. For example, the first electrode 180 may have a multilayered structure of ITO/Mg, ITO/MgF, ITO/Ag, or ITO/Ag/ITO.

The bank layer BK may be disposed on the pixel electrode 170 and the first electrode 180. In the bank layer BK, an opening may be formed in a region overlapping the pixel electrode 170 to expose the pixel electrode 170. Regions in which the exposed pixel electrode 170 overlap the light-emitting layer 175 may be defined as first, second, and third light-emitting parts EMA1, EMA2, and EMA3 according to the color pixels R, G, and B included in each pixel PX.

Also, in the bank layer BK, an opening may be formed in a region overlapping the first electrode 180 to expose the first electrode 180. The opening that exposes the first electrode 180 may provide a space in which the photoelectric conversion layer 185 of each photosensor PS is formed, and a region in which the exposed first electrode 180 overlaps the photoelectric conversion layer 185 may be defined as the light sensing part RA. In this embodiment, the light sensing-part RA may be simultaneously defined by the first hole H1, which exposes the first planarization layer 131 and the second planarization layer 132, and the opening of the bank layer BK which exposes the first electrode 180.

The bank layer BK may include an organic insulating material such as a polyacrylate resin, an epoxy resin, a phenolic resin, a polyamide resin, a polyimide resin, an unsaturated polyester resin, a polyphenylene ether resin, a polyphenylene sulfide resin, or BCB. As another example, the bank layer BK may include an inorganic material such as silicon nitride.

The light-emitting layer 175 may be disposed on the pixel electrode 170 exposed through the opening in the bank layer BK. The light-emitting layer 175 may include a high-molecular material or a low-molecular material and emit red, green, or blue light according to the color pixels R, G, and B included in each pixel PX. The light emitted from the light-emitting layer 175 may contribute to image display or function as a light source incident on the photosensor PS. For example, a light source of a green wavelength emitted from the first light-emitting part EMA1 of the green pixel G may function as a light source incident on the light sensing part RA of the photosensor PS.

When light-emitting layers 175 are formed of an organic material, a hole injecting layer (HIL) and a hole transporting layer (HTL) may be disposed under each light-emitting layer 175, and an electron injecting layer (EIL) and an electron transporting layer (ETL) may be stacked on the light-emitting layer 175. These may be single layers or multiple layers formed of organic materials. In this specification, a region in which the light-emitting layer 175 is disposed is illustrated as being substantially the same as the light-emitting part EMA, but the light-emitting layer 175 may be disposed to cover the bank layer BK beyond the light-emitting part EMA.

The photoelectric conversion layer 185 may be disposed on the first electrode 180 exposed through the opening of the bank layer BK. The photoelectric conversion layer 185 may be disposed in the first hole H1. Specifically, the photoelectric conversion layer 185 may be disposed on the first portion 181 and the first side surface portions 182 of the first electrode 180, and at least a portion thereof may be disposed to cover side surfaces of the bank layer BK disposed outside of the light sensing part RA. The photoelectric conversion layer 185 may have a shape protruding toward the substrate SUB. The photoelectric conversion layer 185 may generate photo-charge in proportion to incident light. The incident light may be light that is emitted from the light-emitting layer 175, reflected by an object outside of the display device 1, and then incident onto the light sensing part RA or light that is externally provided irrespective of the light-emitting layer 175. The charge generated and accumulated in the photoelectric conversion layer 185 may be converted into an electrical signal required for sensing.

The photoelectric conversion layer 185 may include an electron donor material and an electron acceptor material. The electron donor material may generate donor ions in response to light and the electron acceptor material may generate acceptor ions in response to the light. When the photoelectric conversion layer 185 is formed of an organic material, the electron donor material may include a compound, such as subphthalocyanine (subPc) or dibutyl phosphate (DBP), but is not limited thereto. The electron acceptor material may include a compound, such as fullerene, a fullerene derivative, or perylene diimide, but is not limited thereto.

Unlike this, when the photoelectric conversion layer 185 is formed of an inorganic material, the photoelectric conversion element PD may be a p-n or p-i-n phototransistor. For example, the photoelectric conversion element PD may have a structure in which an n-type semiconductor layer, an i-type semiconductor layer, and a p-type semiconductor layer are sequentially stacked.

When photoelectric conversion layers 185 are formed of an organic material, an HIL and an HTL may be disposed under each photoelectric conversion layer 185, and an EIL and an ETL may be stacked on the photoelectric conversion layer 185. These may be a single layer or multiple layers formed of organic materials. In this specification, the photoelectric conversion layer 185 is illustrated as being disposed on the first portion 181 and the first side surface portions 182 of the first electrode 180, but the photoelectric conversion layer 185 may be disposed to cover the bank layer BK. As another example, the photoelectric conversion layer 185 may be disposed only on the first portion 181 of the first electrode 180.

The common electrode 190 may be disposed on the light-emitting layer 175, the photoelectric conversion layer 185, and the bank layer BK. The common electrode 190 may be disposed all over the plurality of pixels PX and the plurality of photosensors PS to cover the light-emitting layer 175, the photoelectric conversion layer 185, and the bank layer BK. The photoelectric conversion element PD and the light-emitting element EL may use the common electrode 190 disposed on the photoelectric conversion layer 185 and the light-emitting layer 175 in common.

The common electrode 190 may include at least a portion protruding toward the substrate SUB. For example, the common electrode 190 may protrude toward the substrate SUB in the first hole H1. The common electrode 190 may also include a portion protruding from the first light-emitting part EMA1 toward the substrate SUB, but the portion may not protrude as much as the portion protruding in the first hole H1.

The distance between the common electrode 190 and the first planarization layer 131 may vary due to the first hole H1. For example, a first distance W1 between the common electrode 190 overlapping the photoelectric conversion layer 185 and the first planarization layer 131 may be smaller than a second distance W2 between the common electrode 190 overlapping the light-emitting layer 175 and the first planarization layer 131. The first distance W1 may be the minimum distance between the common electrode 190 overlapping the first portion 181 of the first electrode 180 in the light sensing part RA and the first planarization layer 131, and the second distance W2 may be the minimum distance between the common electrode 190 overlapping the upper surface of the pixel electrode 170 in the first light-emitting part EMA 1 and the first planarization layer 131.

The common electrode 190 may include a low work function material, for example, Li, Ca, LiF/Ca, LiF/Al, Al, Mg, Ag, Pt, Pd, Ni, Au, Nd, Ir, Cr, BaF, Ba, a compound thereof, or a mixture thereof (e.g., a mixture of Ag and Mg). Alternatively, the common electrode 190 may include a transparent metal oxide, for example, ITO, IZO, or ZnO.

An encapsulation layer TFEL may be disposed on the light-sensitive element layer EML. The encapsulation layer TFEL may include at least one inorganic film to prevent oxygen or moisture from intruding into each of the light-emitting layer 175 and the photoelectric conversion layer 185. Also, the encapsulation layer TFEL may include at least one organic film to protect the light-emitting layer 175 and the photoelectric conversion layer 185 against foreign materials such as dust. For example, the encapsulation layer TFEL may include a structure in which a first inorganic film, an organic film, and a second inorganic film are sequentially stacked. The first inorganic film and the second inorganic film may be formed as multiple films obtained by alternately stacking one or more inorganic films among a silicon nitride layer, a silicon oxynitride layer, a silicon oxide layer, a titanium oxide layer, and an aluminum oxide layer. The organic film may be made of an acryl resin, an epoxy resin, a phenolic resin, a polyamide resin, a polyimide resin, etc.

The light shielding layer LS may be disposed on the encapsulation layer TFEL. The light shielding layer LS may block some of light emitted from the light-emitting part EMA and/or some of light incident onto the light sensing part RA. The light shielding layer LS may prevent color mixing between the color pixels included in each pixel PX and may be disposed not to overlap the first light-emitting part EMA1 so that a ray of light having a total reflection angle may not be blocked among rays of light emitted from each pixel PX. In other words, the light shielding layer LS may not overlap the pixel electrode 170 exposed in the bank layer BK. Also, the light shielding layer LS may be disposed to overlap the light sensing part RA to narrow the fingerprint sensing region LR which is a base for determining fingerprint sensing accuracy of the photosensor PS. In other words, the light shielding layer LS may partially overlap the first portion 181 of the first electrode 180 disposed in the first hole H1 or partially overlap the photoelectric conversion layer 185.

The light shielding layer LS may be covered by the color filter CF. Since the photoelectric conversion layer 185 of the photosensor PS may convert light of a green wavelength into a fingerprint sensing signal, the green color filter CF may be used. The green color filter CF may convert light of a red wavelength or blue wavelength emitted from the light-emitting layer 175 into the light of a green wavelength. Accordingly, it is possible to increase the intensity of signal light compared to that of noise light.

The window WDL may be disposed on the color filter CF. The window WDL may include a rigid material such as glass or quartz. The window WDL may be bonded to the display panel 10 by an optical transparent adhesive or the like.

In the display device 1 according to this embodiment, the first hole H1 exposing the first planarization layer 131 and the second planarization layer 132 is formed in the first planarization layer 131 and the second planarization layer 132 disposed in the light sensing part RA, and thus it is possible to increase the distance between the photoelectric conversion layer 185 and the light shielding layer LS and the distance between the common electrode 190 overlapping the photoelectric conversion layer 185 and the light shielding layer LS. A case in which the fingerprint sensing region LR is reduced with an increase in the distances will be described below.

Figure 9:
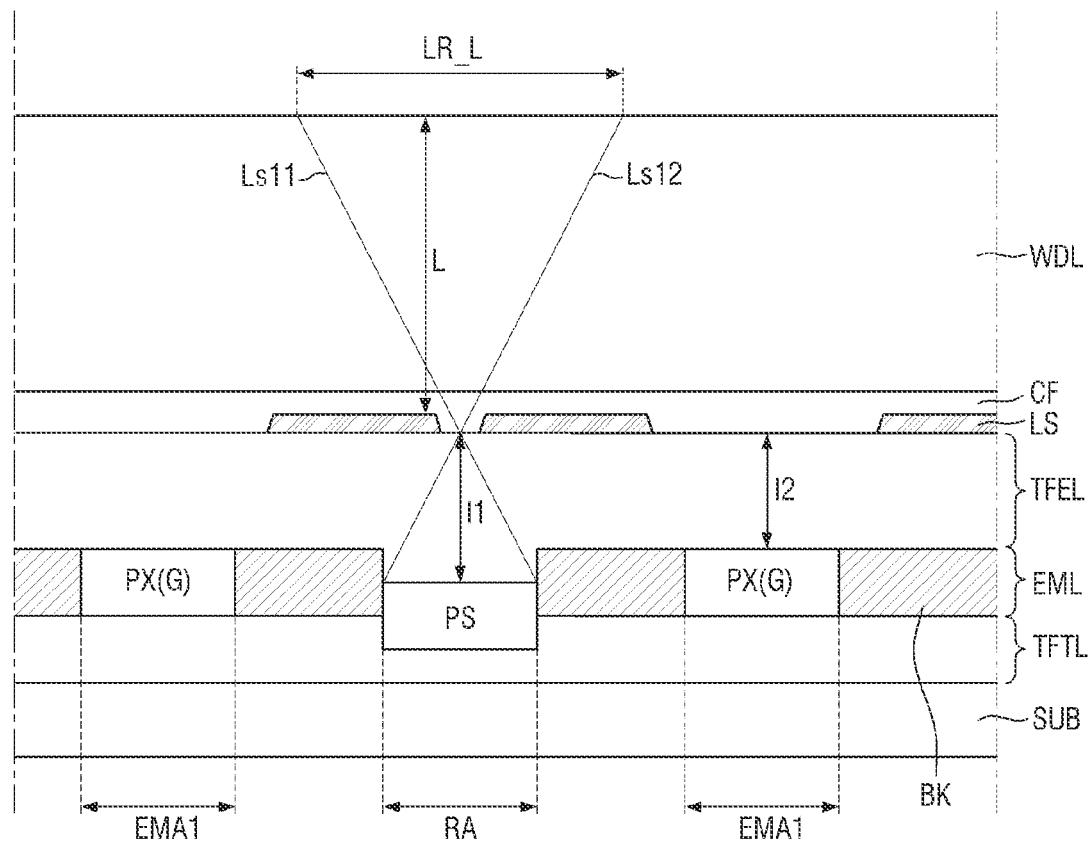
FIG. 9 is a schematic cross-sectional view illustrating an example of a cross section of a display panel corresponding to FIG. 8.
Figure 10:
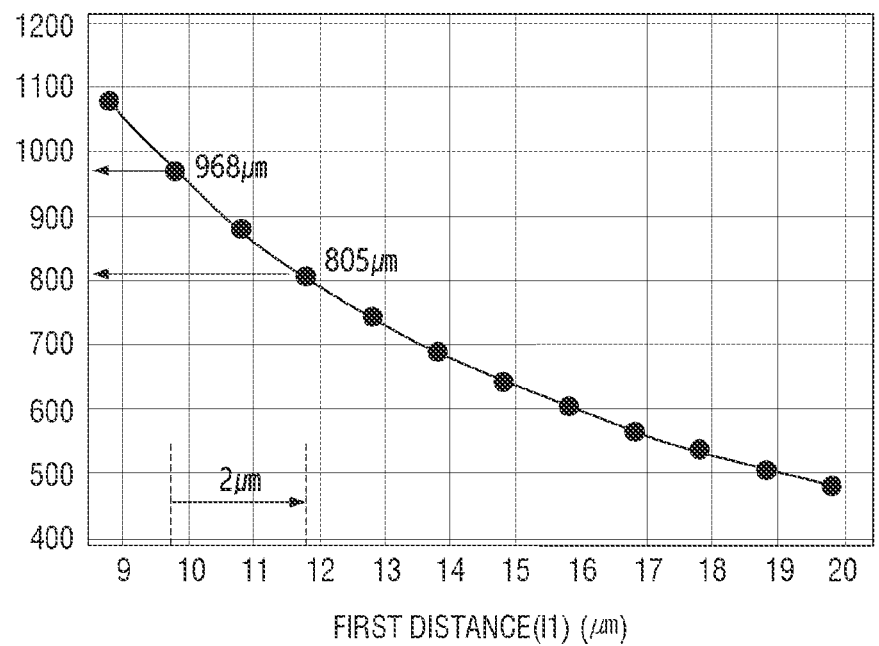
FIG. 10 is a graph illustrating the width of a fingerprint sensing region versus a distance between a photoelectric conversion layer and a light shielding layer according to one embodiment.
Figure 11:
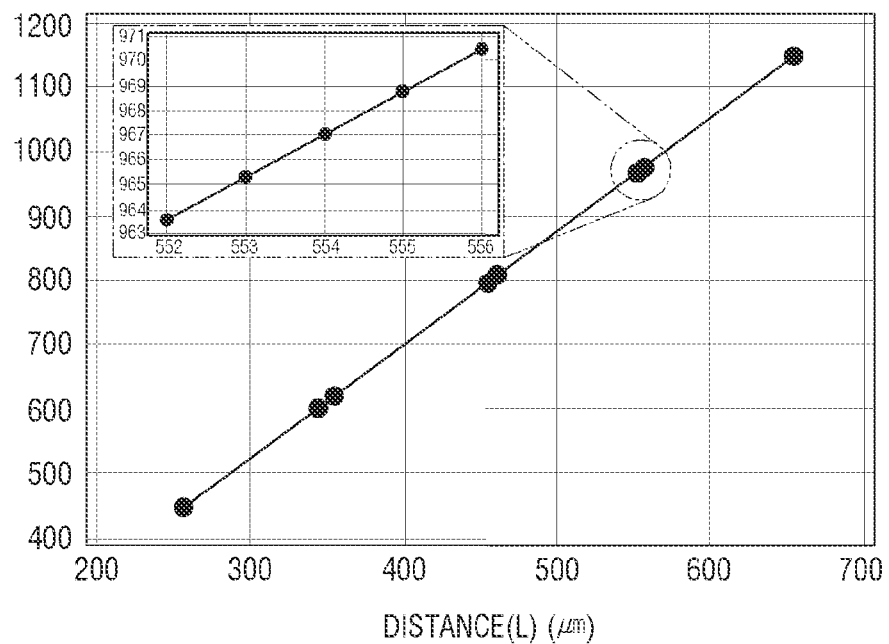
FIG. 11 is a graph illustrating the width of a fingerprint sensing region versus the distance between a light shielding layer and a window according to one embodiment.

FIG. 9 is a schematic cross-sectional view illustrating an example of a display panel corresponding to FIG. 8, FIG. 10 is a graph illustrating the width of a fingerprint sensing region versus the distance between a photoelectric conversion layer and a light shielding layer according to one embodiment, and FIG. 11 is a graph illustrating the width of a fingerprint sensing region versus the distance between a light shielding layer and a window according to one embodiment.

As described above, due to the first hole H1 formed in the light sensing part RA, the first electrode 180 of the photosensor PS, the photoelectric conversion layer 185, and the common electrode 190 disposed in the first hole H1 may have different heights from the pixel electrode 170, the light-emitting layer 175, and the common electrode 190 in the pixel PX spaced apart from the first hole H1. Accordingly, a first distance 11 between the photoelectric conversion layer 185 in the photo sensor PS and the light shielding layer LS may differ from a second distance 12 between the light-emitting layer 175 in the green pixel PX(G) and the light shielding layer LS. The first distance 11 may be greater than the second distance 12. Also, the distance between the common electrode 190 and the light shielding layer LS overlapping the photoelectric conversion layer 185 in the photo sensor PS may be greater than the distance between the common electrode 190 and the light shielding layer LS overlapping the light-emitting layer 175 in the green pixel PX(G).

According to this embodiment, the first distance 11 between the light shielding layer LS and the photosensor PS increases, and thus the fingerprint sensing region LR (or the one-direction width LR_L) may be reduced. In this way, the fingerprint sensing accuracy of the photosensor PS can be improved. Rays of light Ls11 and Ls12 that determine the one-direction width LR_L of the fingerprint sensing region LR will be described in detail below with reference to FIG. 12.

Meanwhile, according to one embodiment, even when the distance L between the light shielding layer LS and the window WDL decreases, the fingerprint sensing region LR may be reduced. Accordingly, this may be taken into consideration to improve the fingerprint sensing accuracy of the photosensor PS.

In FIG. 10, an x-axis represents the first distance 11 between the light shielding layer LS and the photosensor PS, and a y-axis represents the one-direction width LR_L of the fingerprint sensing region LR.

Referring to FIG. 10, for example, when the distance 11 between the light shielding layer LS and the photosensor PS increases by 2 μm, from 10 μm to 12 μm, the one-direction width LR_L of the fingerprint sensing region LR may decrease from 968 μm to 805 μm. Accordingly, when the first distance 11 between the light shielding layer LS and the photosensor PS decreases by 1 μm, the one-direction width LR_L of the fingerprint sensing region LR may decrease by 81.5 μm. The value illustrates a case in which the light shield opening OP_LS of the light shielding layer LS is 6 μm, the width W_RA of the light sensing part RA is 7 μm, and a thickness of the bank layer BK is 7 μm.

Meanwhile, in FIG. 11, an x-axis represents the distance L between the light shielding layer LS and the window WDL, and a y-axis represents the one-direction width LR_L of the fingerprint sensing region LR.

Referring to FIG. 11, for example, when the distance L between the light shielding layer LS and the window WDL decreases by 1 μm, the one-direction width LR_L of the fingerprint sensing region LR may decrease by 1.7 μm.

Accordingly, when the first distance 11 between the light shielding layer LS and the photosensor PS increases in the display device 1 according to this embodiment, the fingerprint sensing region LR may be reduced by a larger width than the increased distance. Meanwhile, a decrease in the distance L between the light shielding layer LS and the window WDL may also be a factor whereby the fingerprint sensing region LR is reduced. Accordingly, fingerprint sensing accuracy of the photosensor PS of the display panel 10 can be improved.

Figure 12:
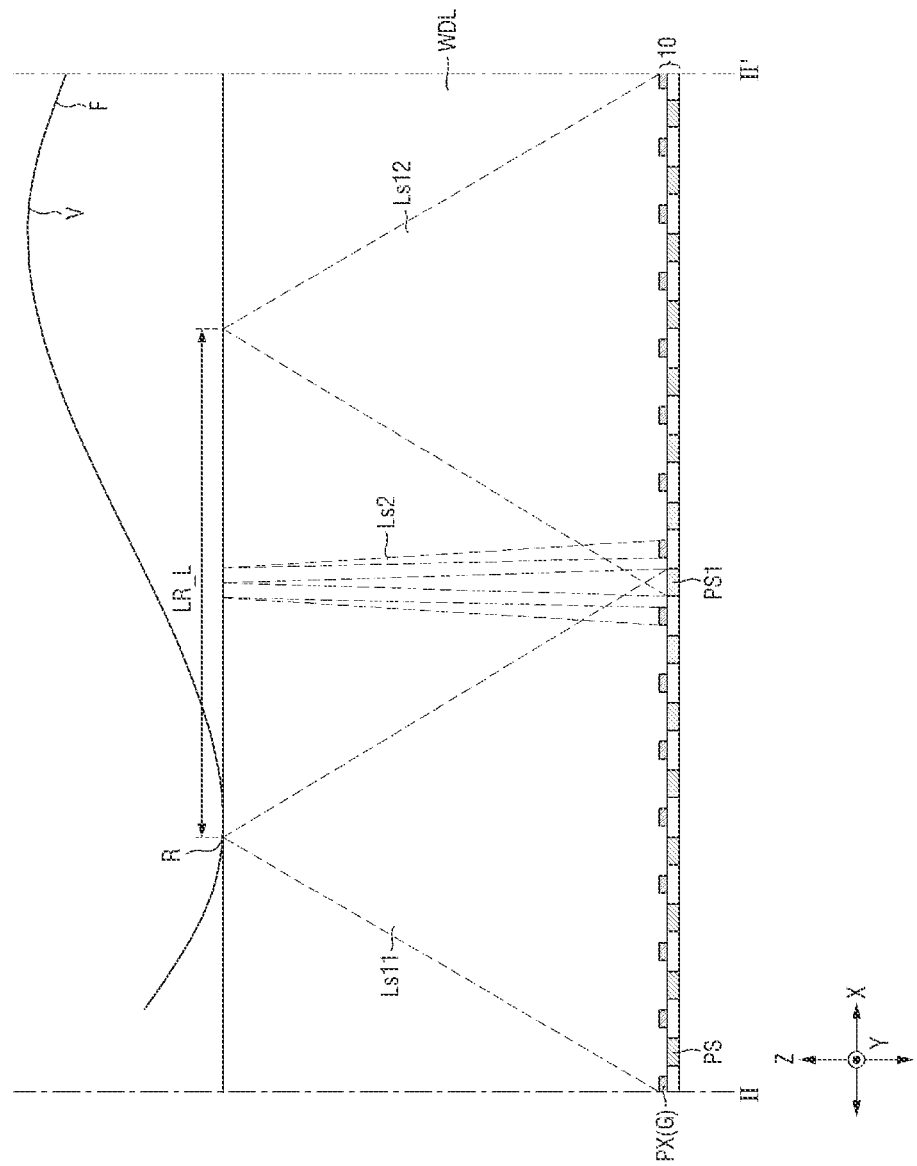
FIG. 12 is an example of a cross-sectional view taken along line II-IF of FIG. 7.
Figure 13:
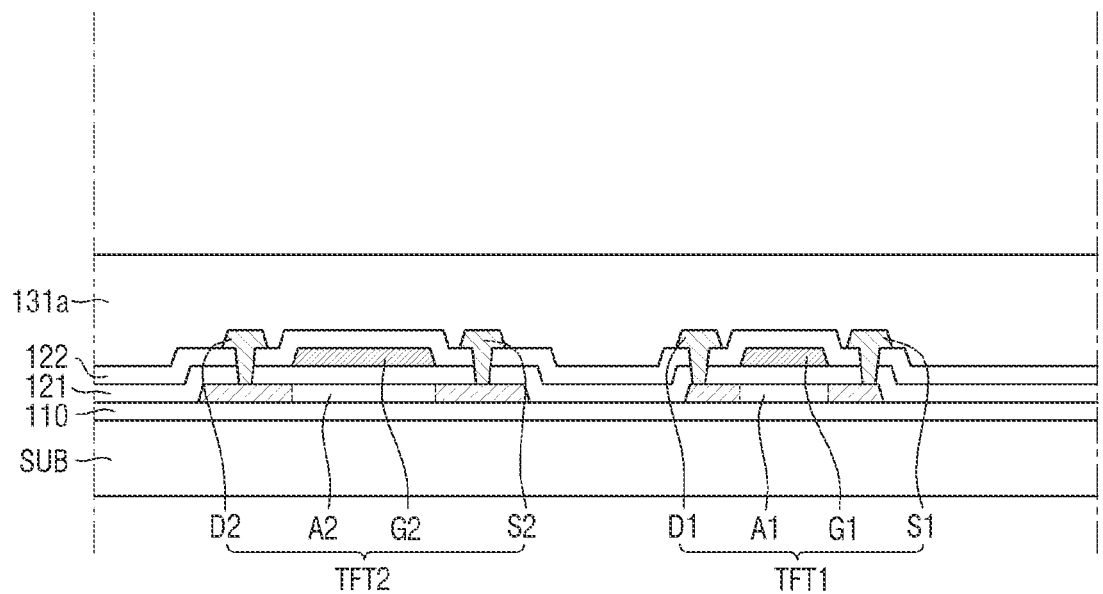
FIGS. 13, 14, 15, 16, 17, 18, 19, 20, 21 and 22 are cross-sectional views illustrating a method of manufacturing a display device according to one embodiment.
Figure 14:
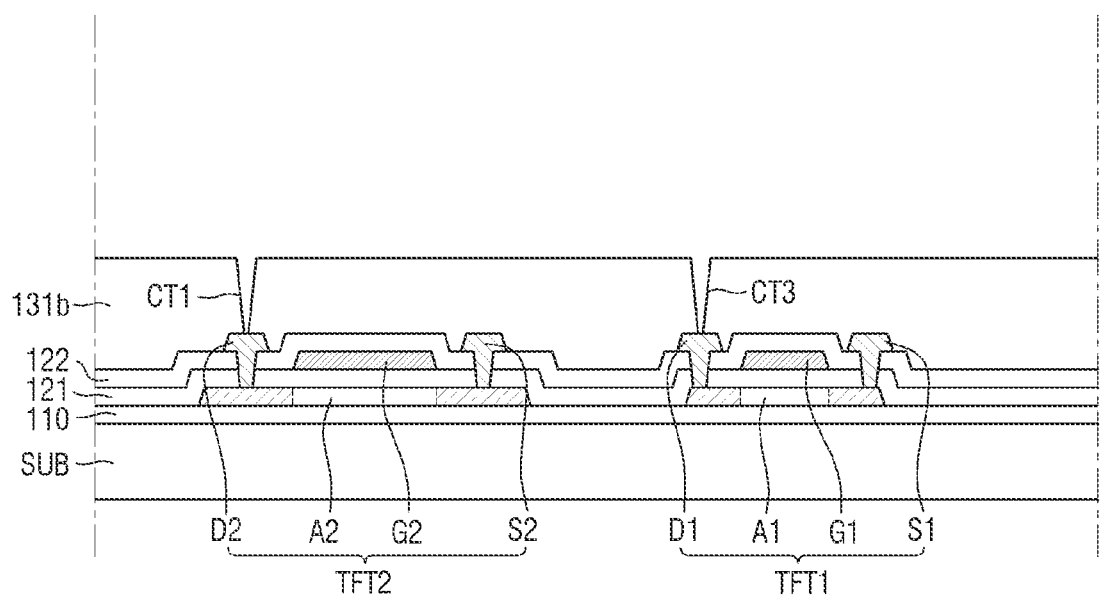
Figure 15:
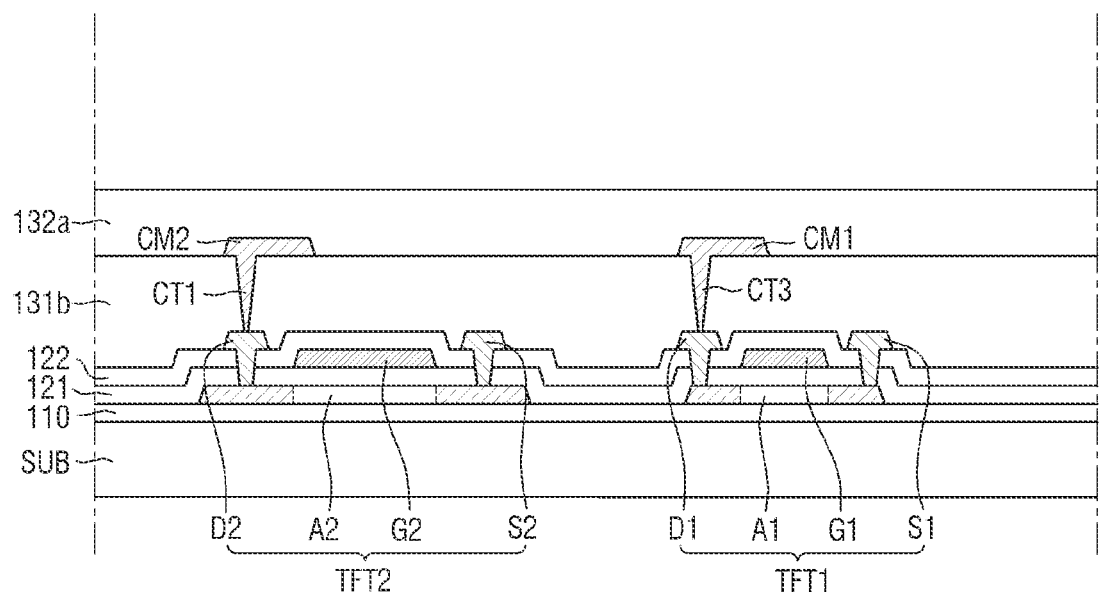
Figure 15:
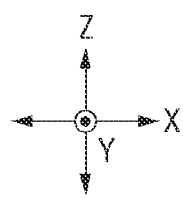

FIG. 12 is an example of a cross-sectional view taken along line II-II' of FIG. 7. A process in which the photosensor PS identifies the fingerprint F will be schematically described with reference to FIG. 12. Although FIG. 12 schematically shows a cross-sectional view of 17 green pixels G and 16 photosensors PS, the number of green pixels G that provide a light source incident on one photosensor PS is not limited thereto.

The fingerprint F of a finger includes ridges R having a specific pattern and valleys V between the ridges R. When the fingerprint F is in contact with the upper surface of the window WDL, the ridges R of the fingerprint F come into contact with the upper surface of the window WDL, but the valleys V of the fingerprint F do not come into contact with the window WDL. In other words, at positions of the valleys V, the upper surface of the window WDL comes into contact with the air.

When the fingerprint F comes into contact with the upper surface of the window WDL, light emitted from the light-emitting parts EMA of the pixels PX (e.g., the first light-emitting parts EMA1 of the green pixels G) may be reflected by the ridges R and the valleys V of the fingerprint F. In this case, since the fingerprint F and the air have different refractive indices, the amount of light reflected by the ridges R of the fingerprint F may differ from the amount of light reflected by the valleys V. Accordingly, the ridges R and the valleys V of the fingerprint F may be derived on the basis of the difference between the amounts of reflected light, that is, light incident on the light sensing parts RA of the photosensors PS. Each of the photosensors PS outputs a photo-current according to an amount of incident light onto the each of the photosensors which is different due to different in light reflectance, and thus it is possible to identify a pattern of the fingerprint F of the finger.

Rays of light Ls11, Ls12, and Ls2 emitted from the first light-emitting parts EMA1 of the green pixels G may include rays of light Ls2 emitted from the green pixels G adjacent to one photosensor PS1 and rays of light Ls11 and Ls12 emitted from the green pixels G spaced far apart from the one photosensor PS1. The rays of light Ls11, Ls12, and Ls2 are reflected toward the one photosensor PS1 at the interface between the upper surface of the window WDL and the air or the interface between the upper surface of the window WDL and the ridges R of the fingerprint F.

The rays of light Ls11 and Ls12 emitted from the green pixels G spaced far apart from the one photosensor PS may have a total reflection angle at the interface between the window WDL and the air. Accordingly, the emitted rays of light Ls11 and Ls12 may be reflected toward the one photosensor PS1. In this case, the one-direction width LR_L of the fingerprint sensing region LR may be determined by the rays of light Ls11 reflected at a first total reflection angle and the rays of light Ls12 reflected at a second total reflection angle. The first total reflection angle and the second total reflection angle may be maximum total reflection angles at which rays of light may be reflected toward to one photosensor PS1.

Meanwhile, a critical angle for total reflection may vary depending on a medium (the air or a fingerprint) coming into contact with the upper surface of the window WDL. When the refractive index of the window WDL has a value of 1.4 to 1.6 and the medium is the air, the critical angle may be 35° to 50°.

The rays of light Ls2 emitted from the green pixels G adjacent to the one photosensor PS1 are light emitted from the first light-emitting parts EMA1 substantially vertically. In other words, the emitted rays of light Ls2 may be rays of light that are reflected without being refracted to the upper surface of the window WDL among rays of light emitted from adjacent green pixels G.

According to this embodiment, the photosensors PS are disposed closer to the substrate SUB than the pixels PX, and thus the distance between the light shielding layer LS and the photosensors PS can be increased. In this way, the fingerprint sensing region LR can be reduced, and it is possible to improve sensing accuracy of the photosensors PS for distinguishing between the ridges R and the valleys V of the fingerprint F.

FIGS. 13 to 22 are cross-sectional views illustrating a method of manufacturing a display device according to one embodiment.

On a substrate SUB, a buffer layer 110, semiconductor layers A1 and A2, a gate insulating layer 121 disposed on portions of the semiconductor layers A1 and A2, gate electrodes G1 and G2 disposed on the gate insulating layer 121, an interlayer insulating film 122 covering each of the semiconductor layers A1 and A2 and each of the gate electrodes G1 and G2, and source electrodes S1 and S2 and drain electrodes D1 and D2 disposed on the interlayer insulating film 122 are sequentially formed.

The semiconductor layers A1 and A2 may be channels of a first thin film transistor TFT1 and a second thin film transistor TFT2, respectively. The semiconductor layers A1 and A2 may include polycrystalline silicon and the like as described above with reference to FIG. 8.

A first planarization layer 131a may be formed on the interlayer insulating film 122 to cover each of the source electrodes S1 and S2 and the drain electrodes D1 and D2.

A third contact hole CT3 is formed in a first planarization layer 131b to expose the first drain electrode D1. Also, a first contact hole CT1 is formed in the first planarization layer 131b to expose the second drain electrode D2. The first contact hole CT1 and the third contact hole CT3 may pass through the first planarization layer 131b.

On the first planarization layer 131b, a first connection electrode CM1 is formed to be connected to the first drain electrode D1 through the third contact hole CT3, and a second connection electrode CM2 is formed to be connected to the second drain electrode D2 through the first contact hole CT1.

Figure 16:
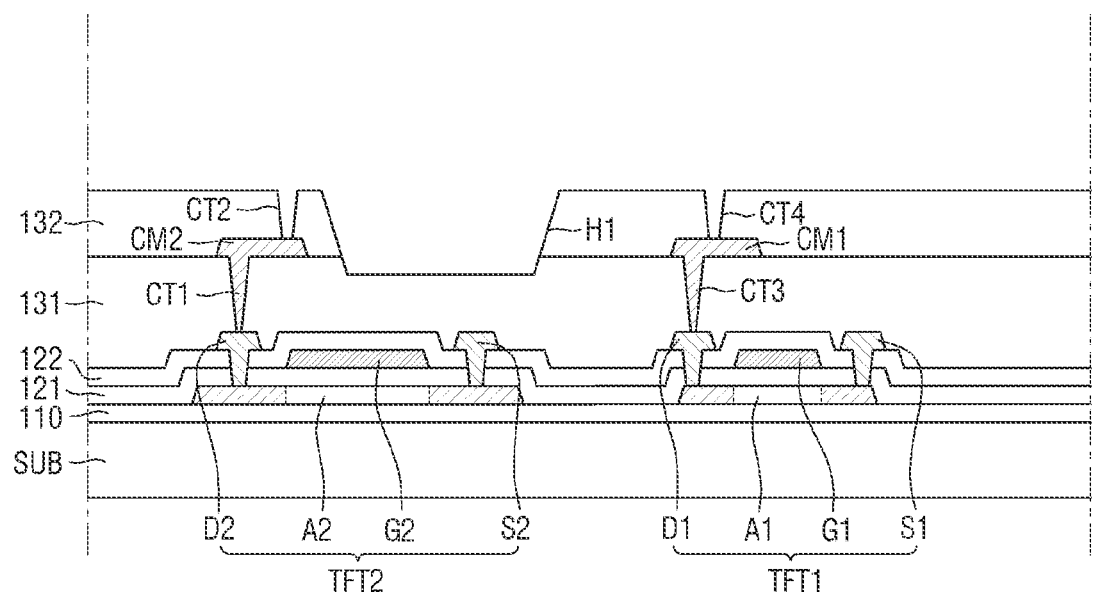
Figure 17:
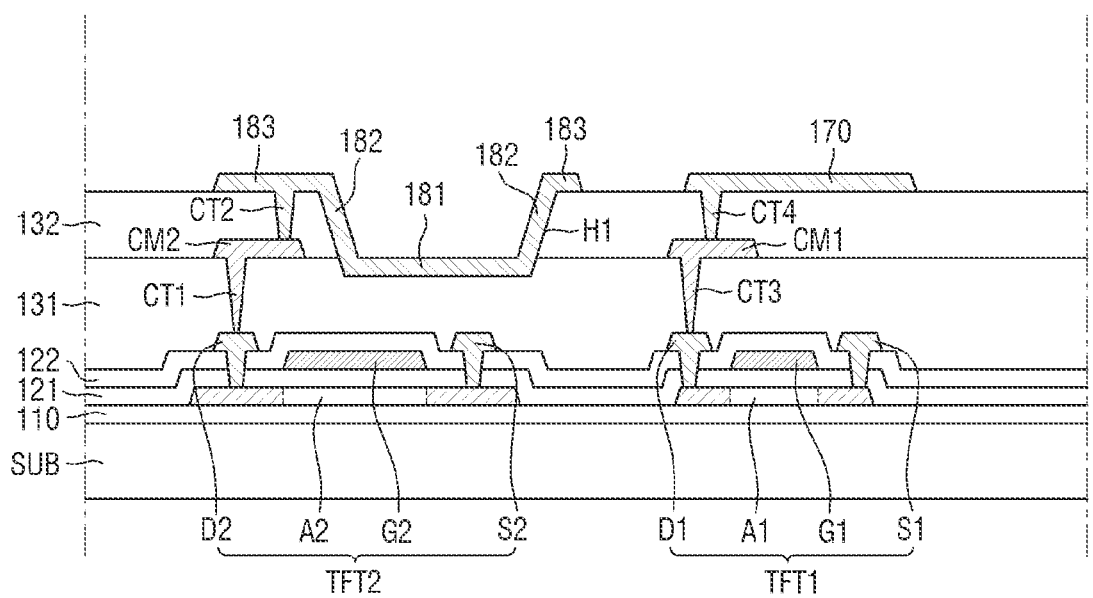
Figure 18:
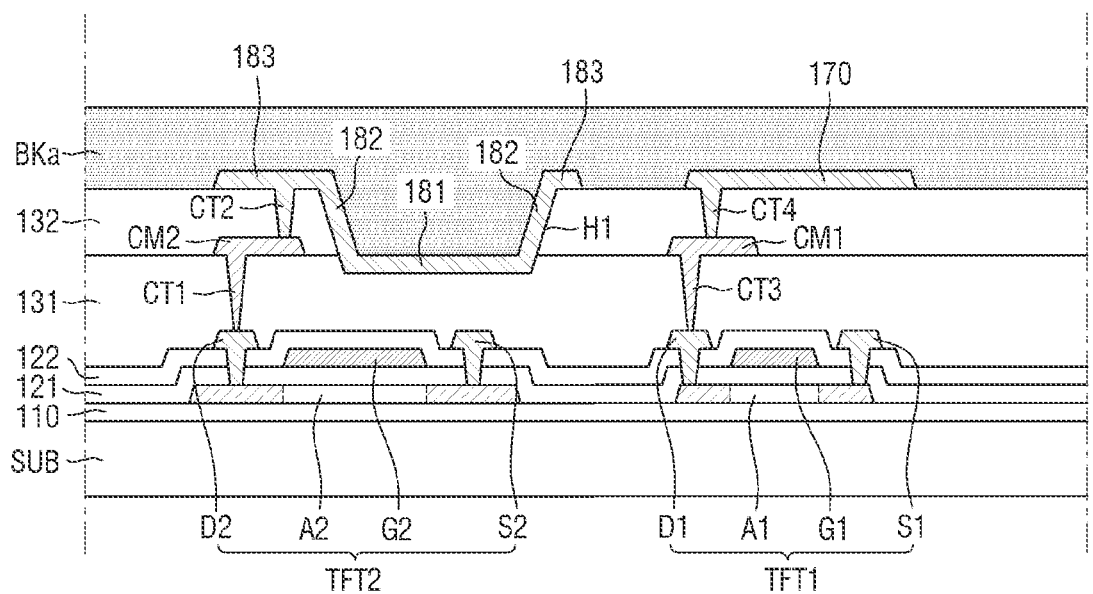
Figure 19:
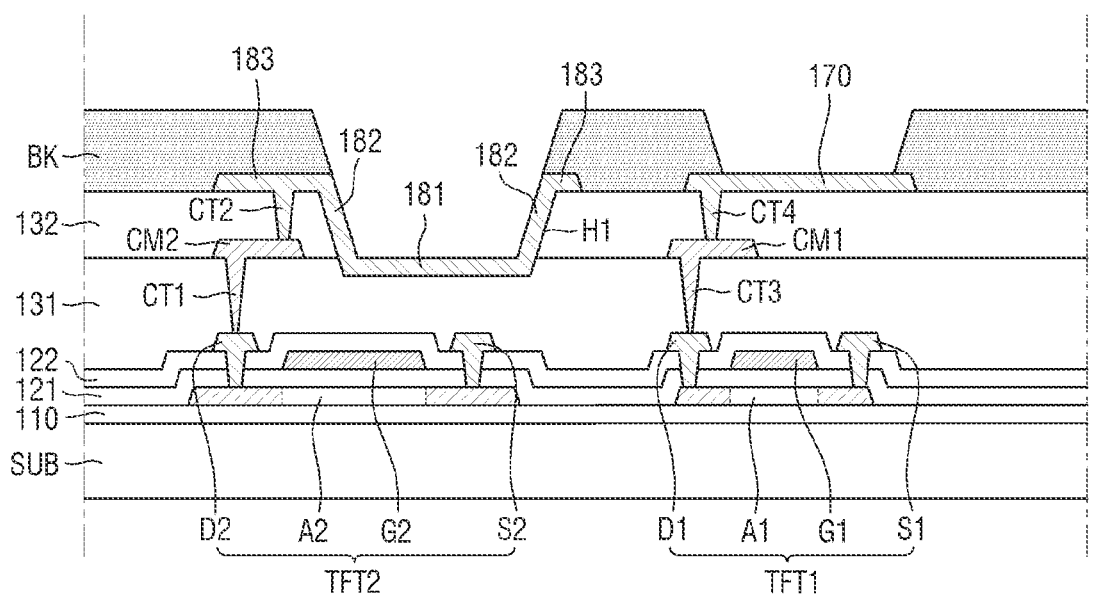
Figure 20:
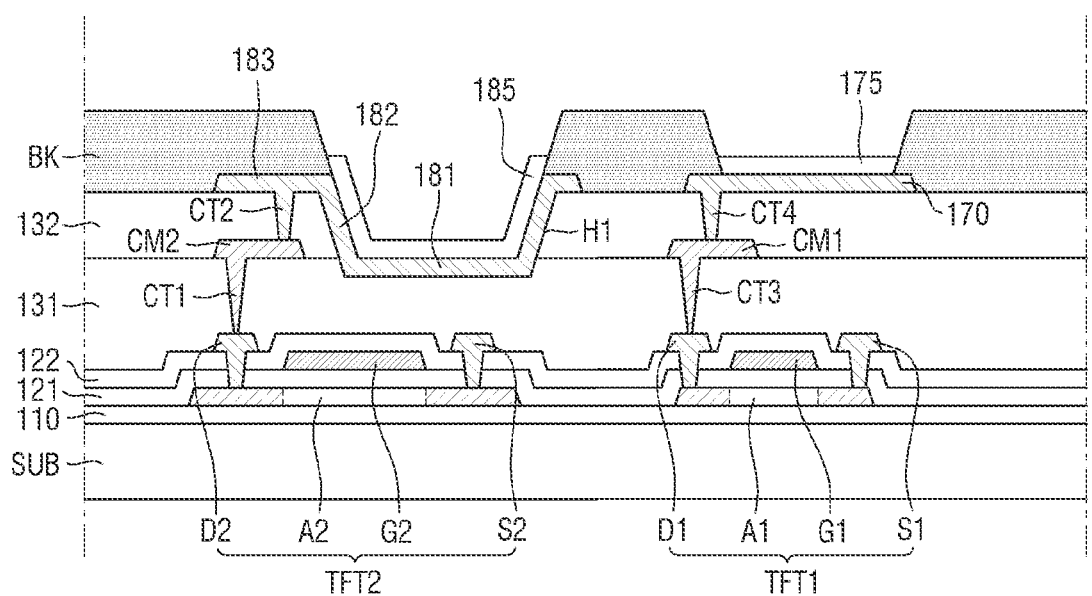
Figure 21:
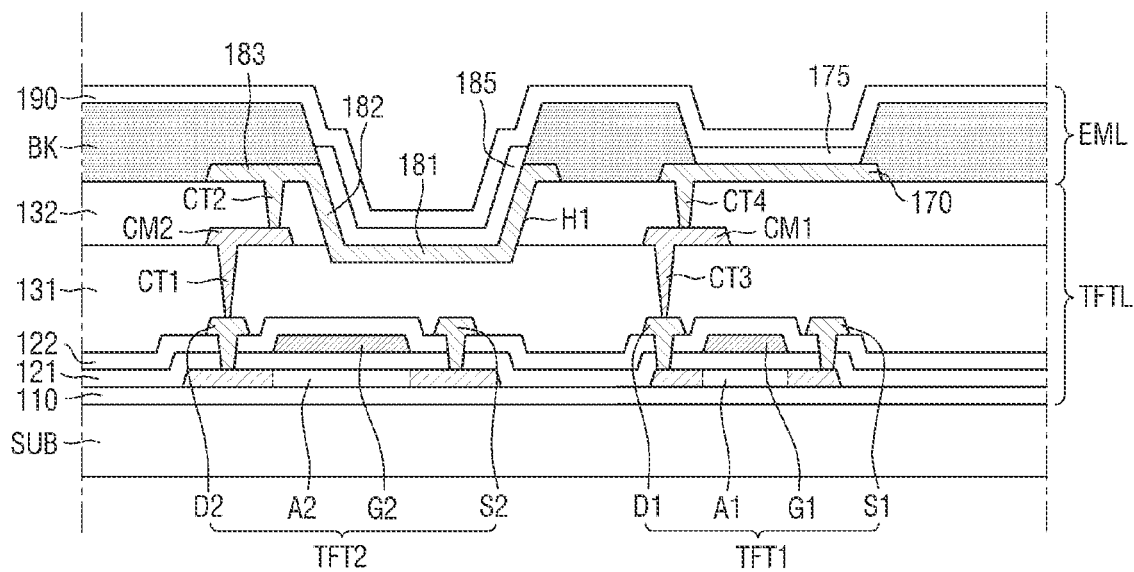
Figure 22:
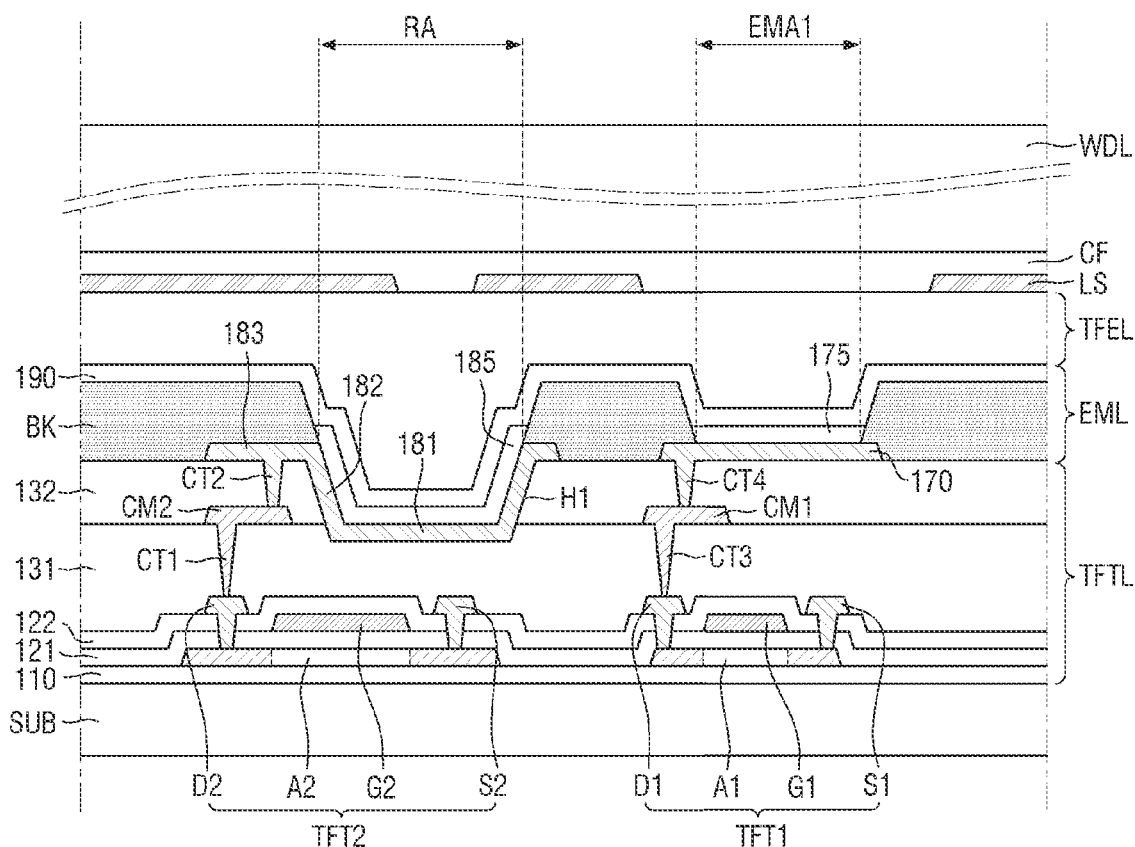

A second planarization layer 132a is formed on the first planarization layer 131b to cover the first and second connection electrodes CM1 and CM2. In the second planarization layer 132a, a fourth contact hole CT4 is formed to expose the first connection electrode CM1 and a second contact hole CT2 is formed to expose the second connection electrode CM2. In FIG. 16, the second contact hole CT2, the fourth contact hole CT4, and a first hole H1 may be simultaneously formed using a mask.

The first hole H1 is formed to simultaneously expose a first planarization layer 131 and a second planarization layer 132. The first hole H1 may be formed by completely exposing the second planarization layer 132 and by partially exposing an upper portion of the first planarization layer 131, and by removing the exposed portion of the first planarization layer 131 and the second planarization layer 132. The first hole H1 may be formed to completely pass through the second planarization layer 132 and to partially pass through the first planarization layer 131 on an upper portion of the first planarization layer 131. The first hole H1 may expose the upper surface and side surfaces of the first planarization layer 131 and side surfaces of the second planarization layer 132.

A first electrode 180 is formed on the second planarization layer 132 to cover the side surfaces of the first planarization layer 131, side surfaces of the second planarization layer 132, and the upper surface of the first planarization layer 131 exposed through the first hole H1. The first electrode 180 may include a first portion 181 disposed on the upper surface of the first planarization layer 131 exposed through the first hole H1, first side surface portions 182 disposed on the side surfaces of the first planarization layer 131 and the side surfaces of the second planarization layer 132 exposed through the first hole H1, and a second portion 183 disposed on the upper surfaces of the second planarization layer 132 not exposed through the first hole H1. Also, a pixel electrode 170 is formed on the upper surface of the second planarization layer 132 to be spaced apart from the first hole H1.

A thickness of the first planarization layer 131 may vary due to the first hole H1. For example, a first thickness T1 (see FIG. 8) of the first planarization layer 131 overlapping the first portion 181 may be thinner than a second thickness T2 (see FIG. 8) of the first planarization layer 131 overlapping the pixel electrode 170. A third thickness T3 (see FIG. 8) of the first planarization layer 131 overlapping the second portion 183 may be substantially the same as the second thickness T2 of the first planarization layer 131 and thicker than the first thickness T1 of the first planarization layer 131 in an area corresponding to the first hole H1.

A bank layer BKa is formed on the pixel electrode 170 and the first electrode 180. The bank layer BKa may cover both the pixel electrode 170 and the first electrode 180.

In a bank layer BK, an opening may be formed in a region overlapping the pixel electrode 170 to expose the pixel electrode 170. A region in which the exposed pixel electrode 170 overlaps a light-emitting layer 175 may be defined as first, second, and third light-emitting parts EMA1, EMA2, and EMA3 according to color pixels R, G, and B included in each pixel PX. In the bank layer BK, an opening may be formed in a region overlapping the first electrode 180 to expose the first electrode 180. The opening that exposes the first electrode 180 may provide a space in which a photoelectric conversion layer 185 of each photosensor PS is formed and a region in which the exposed first electrode 180 overlaps the photoelectric conversion layer 185 may be defined as a light sensing part RA.

The light-emitting layer 175 is formed on the pixel electrode 170 exposed through the opening. The photoelectric conversion layer 185 is formed on the first electrode 180 exposed through the opening of the bank layer BK. The photoelectric conversion layer 185 may be disposed in the first hole H1. Specifically, the photoelectric conversion layer 185 may be disposed on the first portion 181 and the first side surface portions 182 of the first electrode 180, and at least a portion thereof may be disposed to cover a side surface of the bank layer BK disposed adjacent to the light sensing part RA. The photoelectric conversion layer 185 may have a shape protruding toward the substrate SUB.

A common electrode 190 is formed on the light-emitting layer 175, the photoelectric conversion layer 185, and the bank layer BK. The common electrode 190 may be disposed all over a plurality of pixels PX and a plurality of photosensors PS to cover the light-emitting layer 175, the photoelectric conversion layer 185, and the bank layer BK.

The common electrode 190 may include at least a portion protruding toward the substrate SUB. For example, the common electrode 190 may protrude toward the substrate SUB in the first hole H1. The common electrode 190 may also include a portion protruding from the first light-emitting part EMA1 toward the substrate SUB, but the portion may not protrude as much as the portion protruding in the first hole H1.

The distance between the common electrode 190 and the first planarization layer 131 may vary due to the first hole H1. For example, a first distance W1 (see FIG. 8) between the common electrode 190 overlapping the photoelectric conversion layer 185 and the first planarization layer 131 may be smaller than a second distance W2 (see FIG. 8) between the common electrode 190 overlapping the light-emitting layer 175 and the first planarization layer 131. The first distance W1 may be the distance between the common electrode 190 overlapping the first portion 181 of the first electrode 180 in the light sensing part RA and the first planarization layer 131, and the second distance W2 may be the distance between the common electrode 190 overlapping an upper surface of the pixel electrode 170 in the first light-emitting part EMA 1 and the first planarization layer 131.

A light-emitting element EL may include the pixel electrode 170, the light-emitting layer 175, and the common electrode 190, and a photoelectric conversion element PD may include the first electrode 180, the photoelectric conversion layer 185, and the common electrode 190.

An encapsulation layer TFEL, a light shielding layer LS, a color filter CF, and a window WDL are sequentially formed on the common electrode 190. A first distance 11 (see FIG. 9) between the photoelectric conversion layer 185 and the light shielding layer LS may differ from a second distance 12 (see FIG. 9) between the light-emitting layer 175 and the light shielding layer LS. The first distance 11 may be greater than the second distance 12.

According to this embodiment, the distance between the light shielding layer LS and the photosensor PS increases, and thus a fingerprint sensing region LR may be reduced. In this way, fingerprint sensing accuracy of a display device 1 can be improved.

A cross-sectional view of a display device 1 according to other embodiments will be described below with reference to FIGS. 23 and 24.

Figure 23:
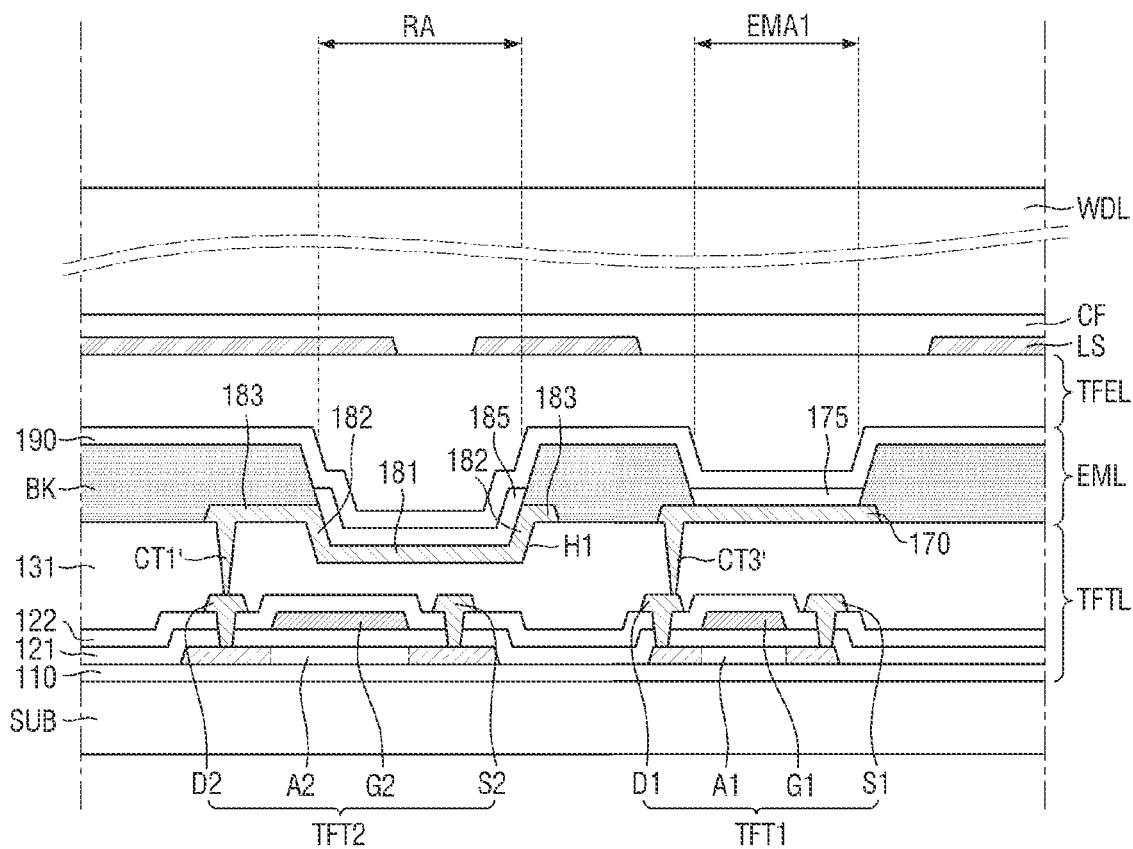
FIG. 23 is a cross-sectional view illustrating another example of a display device taken along line I-I' of FIG. 7.

FIG. 23 is a cross-sectional view illustrating another example of a display device taken along line I-I' of FIG. 7.

A display device 1 according to this embodiment is different from the previous embodiment in that no second planarization layer is disposed and a light-sensitive element layer EML is disposed on a first planarization layer 131. FIG. 23 is the same as FIG. 8 in that a first hole H1 exposing the first planarization layer 131 is included.

The first planarization layer 131 may include a third contact hole CT3' exposing a first drain electrode D1 and a first contact hole CT1' exposing a second drain electrode D2.

The first planarization layer 131 may include the first hole H1 formed in the first planarization layer 131. The first hole H1 may be recessed from an upper surface of the first planarization layer 131 to have a predetermined depth to form a recessed portion in the first planarization layer 131. For example, the first hole H1 may expose side surfaces and an upper surface of the recessed portion of the first planarization layer 131. The first hole H1 may provide a space in which a first electrode 180, a photoelectric conversion layer 185, and a common electrode 190 overlapping the first electrode 180 and the photoelectric conversion layer 185 of a photoelectric conversion element PD are formed.

A thickness of the first planarization layer 131 may vary depending on a position where the first hole H1 is formed. For example, a first thickness of the first planarization layer 131 in an area corresponding to the first hole H1 may be thinner than a second thickness of the first planarization layer 131 in an area other than the area corresponding to the first hole H1.

A pixel electrode 170 of a light-emitting element EL and the first electrode 180 of the photoelectric conversion element PD may be disposed on the first planarization layer 131. The pixel electrode 170 may be disposed to be spaced apart from the first hole H1 and connected to the first drain electrode D1 through the third contact hole CT3'. The first electrode 180 may be disposed in the first hole H1 and connected to the second drain electrode D2 through the first contact hole CT1'.

The first electrode may include a first portion 181 disposed on an upper surface of the first planarization layer 131 having the first thickness, first side surface portions 182 disposed on side surfaces of the first planarization layer 131, and second portions 183 disposed on an upper surface of the first planarization layer 131 having the second thickness. In other words, the first electrode 180 may have a shape protruding toward a substrate SUB.

The first portion 181 is a portion formed at a lower position than the pixel electrode 170, and the second portions 183 may be portions formed at substantially the same height as the pixel electrode 170. The second portions 183 may be a portion in which the first contact hole CT1' is formed.

Meanwhile, the photoelectric conversion layer 185 and the common electrode 190 overlapping the photoelectric conversion layer 185 also have a shape protruding toward the substrate SUB, and thus a first distance between the common electrode 190 overlapping the photoelectric conversion layer 185 and the first planarization layer 131 may be smaller than a second distance between the common electrode 190 overlapping a light-emitting layer 175 and the first planarization layer 131. Also, a first distance between the photoelectric conversion layer 185 and a light shielding layer LS may be larger than a second distance between the light-emitting layer 175 and the light shielding layer LS.

In the display device 1 according to this embodiment, a distance between the light shielding layer LS and a photosensor PS may increase, and thus the area of a fingerprint sensing region LR can be reduced. Accordingly, it is possible to ensure accuracy in fingerprint sensing while minimizing a reduction in the amount of light received by the photosensor PS.

Figure 24:
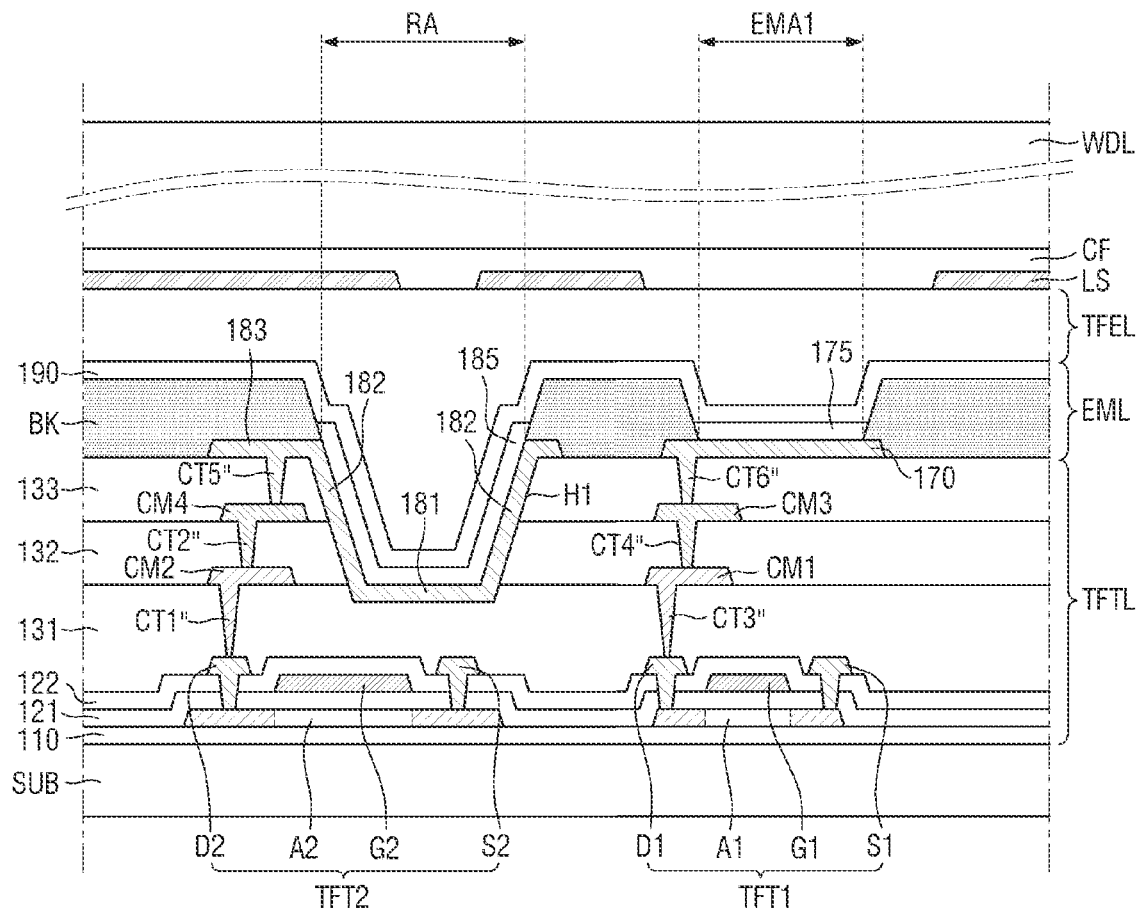
FIG. 24 is a cross-sectional view illustrating still another example of a display device taken along line I-I' of FIG. 7.
Figure 24:
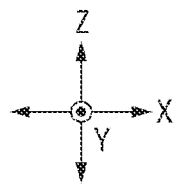

FIG. 24 is a cross-sectional view illustrating still another example of a display device taken along line I-I' of FIG. 7.

A display device 1 according to this embodiment is different from the previous embodiment in that a third planarization layer 133 is additionally disposed on a first planarization layer 131 and a second planarization layer 132. A first hole H1 may simultaneously expose the first, second, and third planarization layers 131, 132, and 133.

Specifically, the first planarization layer 131 may include a third contact hole CT3" that exposes a first drain electrode D1 and a first contact hole CT1" that exposes a second drain electrode D2. A first connection electrode CM1 may be electrically connected to the first drain electrode D1 through the third contact hole CT3" passing through the first planarization layer 131, and a second connection electrode CM2 may be electrically connected to the second drain electrode D2 through the first contact hole CT1" passing through the first planarization layer 131.

The second planarization layer 132 may include a second contact hole CT2" that exposes the second connection electrode CM2 and a fourth contact hole CT4" that exposes the first connection electrode CM1. A third connection electrode CM3 may be electrically connected to the first connection electrode CM1 through the fourth contact hole CT4" passing through the second planarization layer 132, and a fourth connection electrode CM4 may be electrically connected to the second connection electrode CM2 through the second contact hole CT2" passing through the second planarization layer 132.

The third planarization layer 133 may be formed on the second planarization layer 132 to cover the third and fourth connection electrodes CM3 and CM4. The third planarization layer 133 may include the same material as the first planarization layer 131 and the second planarization layer 132 described above. The third planarization layer 133 may have a flat surface. The third planarization layer 133 may include a sixth contact hole CT6" that exposes the third connection electrode CM3 and a fifth contact hole CT5" that exposes the fourth connection electrode CM4.

The first planarization layer 131, the second planarization layer 132, and the third planarization layer 133 may include the first hole H1 that simultaneously exposes the first to third planarization layers 131 to 133. Specifically, the first hole H1 may completely pass through the second planarization layer 132 and the third planarization layer 133 and may partially pass through the first planarization layer 131. For example, the first hole H1 may expose side surfaces and an upper surface of the first planarization layer 131, side surfaces of the second planarization layer 132, and side surfaces of the third planarization layer 133. The first hole H1 may provide a space in which a first electrode 180, a photoelectric conversion layer 185, and a common electrode 190 of a photoelectric conversion element PD to be described below are formed.

A pixel electrode 170 of a light-emitting element EL and the first electrode 180 of the photoelectric conversion element PD may be disposed on the third planarization layer 133. The pixel electrode 170 may be disposed to be spaced apart from the first hole H1 and connected to the third connection electrode CM3 through the sixth contact hole CT6". The first electrode 180 may be disposed in the first hole H1 and connected to the fourth connection electrode CM4 through the fifth contact hole CT5".

The first electrode 180 may include a first portion 181 disposed on an upper surface of a recessed portion formed in the first planarization layer 131, first side surface portions 182 disposed on side surfaces of the first planarization layer 131, the side surfaces of the second planarization layer 132, and the side surfaces of the third planarization layer 133, and second portions 183 disposed on an upper surface of the third planarization layer 133. In other words, the first electrode 180 may have a shape protruding toward a substrate SUB.

The first portion 181 is a portion formed at a lower position than the pixel electrode 170, and the second portions 183 may be portions formed at substantially the same height as the pixel electrode 170. The second portion 183 may be a portion in which the fifth contact hole CT5" is formed.

Meanwhile, the photoelectric conversion layer 185 and the common electrode 190 overlapping the photoelectric conversion layer 185 also have a shape protruding toward the substrate SUB, and thus a first distance between the common electrode 190 overlapping the photoelectric conversion layer 185 and the first planarization layer 131 may be smaller than a second distance between the common electrode 190 overlapping a light-emitting layer 175 and the first planarization layer 131. Also, a first distance between the photoelectric conversion layer 185 and a light shielding layer LS may be larger than a second distance between the light-emitting layer 175 and the light shielding layer LS.

In the display device 1 according to this embodiment, the distance between the light shielding layer LS and a photosensor PS may increase compared to the previous embodiment, and thus the area of a fingerprint sensing region LR can be additionally reduced. Accordingly, it is possible to ensure accuracy in fingerprint sensing while minimizing a reduction in the amount of light received by the photosensor PS.

According to the embodiments, a light sensor is formed at a lower position than a pixel (i.e., closer to a substrate), and thus it is possible to provide a display device in which the distance between the light sensor and a light shielding layer is increased. Accordingly, accuracy in fingerprint sensing of the display device can be improved.

According to the embodiments, a light sensor is formed at a lower position than a pixel (i.e., closer to a substrate), and thus it is possible to provide a method of manufacturing a display device in which the distance between a light sensor and a light shielding layer is increased.

Effects of the embodiments are not limited to those described above, and various other effects are included in this specification.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:
   a substrate;
   a first planarization layer disposed on the substrate, the first planarization layer including a recessed portion recessed from an upper surface of the first planarization layer;
   a first electrode disposed on an upper surface and side surfaces of the recessed portion formed in the first planarization layer;
   a pixel electrode disposed on the upper surface of the first planarization layer to be spaced apart from the first electrode;
   a photoelectric conversion layer disposed on the first electrode;
   a light-emitting layer disposed on the pixel electrode; and
   a second planarization layer disposed on the first planarization layer,
   wherein the first electrode comprises:
   a first portion disposed on the upper surface of the recessed portion; and
   a second portion disposed on the upper surface of the first planarization layer other than the recessed portion, and
   wherein the second planarization layer comprises:
   a first hole formed through the second planarization layer in an area corresponding the recessed portion, and
   a contact hole formed in an area corresponding to the second portion of the first electrode.

2. The display device of claim 1, wherein a first thickness of the first planarization layer overlapping the first portion is different from a second thickness of the first planarization layer overlapping the pixel electrode.

3. The display device of claim 2, wherein the first thickness is thinner than the second thickness.

4. The display device of claim 3, wherein a third thickness of the first planarization layer overlapping the second portion is thicker than the first thickness.

5. The display device of claim 2, wherein the second portion is not disposed in the recessed portion.

6. The display device of claim 1, wherein the contact hole exposes a portion of a connection electrode disposed on the first planarization layer.

7. The display device of claim 1, wherein at least a portion of the photoelectric conversion layer is disposed on the recessed portion to be protruded toward the substrate.

8. The display device of claim 1, further comprising a common electrode disposed on the photoelectric conversion layer and the light-emitting layer.

9. The display device of claim 8, wherein a first distance between the common electrode overlapping the photoelectric conversion layer and the first planarization layer is smaller than a second distance between the common electrode overlapping the light-emitting layer and the first planarization layer.

10. A display device comprising:
    a substrate;

a first planarization layer disposed on the substrate, the first planarization layer including a recessed portion recessed from an upper surface of the first planarization layer;
a first electrode disposed on the first planarization layer to overlap the recessed portion;
a pixel electrode disposed on the first planarization layer;
a photoelectric conversion layer disposed on the first electrode;
a light-emitting layer disposed on the pixel electrode; and
a common electrode disposed on the photoelectric conversion layer and the light-emitting layer,
wherein a first distance between the common electrode overlapping the photoelectric conversion layer and the first planarization layer differs from a second distance between the common electrode overlapping the light-emitting layer and the first planarization layer, wherein a first distance between the common electrode overlapping the photoelectric conversion layer and the first planarization layer differs from a second distance between the common electrode overlapping the light-emitting layer and the first planarization layer.

11. The display device of claim 10, wherein the first distance is smaller than the second distance.

12. The display device of claim 10, further comprising:
a bank layer disposed on the first planarization layer to cover a portion of the first electrode and a portion of the pixel electrode; and
a light shielding layer disposed on the bank layer.

13. The display device of claim 12, wherein a first distance between the photoelectric conversion layer and the light shielding layer is different from a second distance between the light-emitting layer and the light shielding layer.

14. The display device of claim 13, wherein the first distance is larger than the second distance.

15. The display device of claim 13, wherein the light shielding layer partially overlaps the photoelectric conversion layer.

16. The display device of claim 13, wherein the light shielding layer does not overlap the pixel electrode partitioned by the bank layer.

17. The display device of claim 10, wherein the first electrode is disposed on an upper surface and side surfaces of the recessed portion.

18. A method of manufacturing a display device, the method comprising:
forming a first planarization layer on a substrate;
forming a recessed portion in the first planarization layer;
forming a first electrode on an upper surface and side surfaces of the recessed portion and a pixel electrode on the first planarization layer to be spaced apart from the recessed portion;
forming a second planarization layer disposed on the first planarization layer;
forming a photoelectric conversion layer on the first electrode;
forming a light-emitting layer on the pixel electrode; and
forming a common electrode on the photoelectric conversion layer and the light-emitting layer,
wherein the first electrode comprises:
a first portion disposed on the upper surface of the recessed portion; and
a second portion disposed on the upper surface of the first planarization layer other than the recessed portion, and
wherein the second planarization layer comprises:
a first hole formed through the second planarization layer in an area corresponding the recessed portion, and
a contact hole formed in an area corresponding to the second portion of the first electrode.

* * * * *